(12) United States Patent
Haukka et al.

(10) Patent No.: US 8,025,922 B2
(45) Date of Patent: Sep. 27, 2011

(54) ENHANCED DEPOSITION OF NOBLE METALS

(75) Inventors: Suvi P. Haukka, Helsinki (FI); Marko J. Tuominen, Helsinki (FI); Antti Rahtu, Vantaa (FI)

(73) Assignee: ASM International N.V., Almere (NL)

( * ) Notice: Subject to any disclaimer, the term of this patent is extended or adjusted under 35 U.S.C. 154(b) by 1035 days.

(21) Appl. No.: 11/375,819

(22) Filed: Mar. 14, 2006

(65) Prior Publication Data

US 2007/0036892 A1    Feb. 15, 2007

Related U.S. Application Data

(60) Provisional application No. 60/662,145, filed on Mar. 15, 2005, provisional application No. 60/662,144, filed on Mar. 15, 2005.

(51) Int. Cl.
C23C 16/00 (2006.01)

(52) U.S. Cl. .................................... 427/248.1

(58) Field of Classification Search .................. None
See application file for complete search history.

(56) References Cited

U.S. PATENT DOCUMENTS

| | | | |
|---|---|---|---|
| 4,058,430 A | 11/1977 | Suntola et al. | |
| 4,210,608 A | 7/1980 | Pinke | |
| 4,477,296 A | 10/1984 | Nair | |
| 4,604,118 A * | 8/1986 | Bocko et al. | 65/416 |
| 4,670,110 A | 6/1987 | Withers et al. | |
| 4,860,687 A | 8/1989 | Frijlink | |
| 4,891,050 A | 1/1990 | Bowers et al. | |
| 4,902,551 A | 2/1990 | Nakaso et al. | |
| 4,965,656 A | 10/1990 | Koubuchi et al. | |
| 5,106,454 A | 4/1992 | Allardyce et al. | |
| 5,382,333 A | 1/1995 | Ando et al. | |
| 5,391,517 A | 2/1995 | Gelatos et al. | |
| 5,453,494 A | 9/1995 | Kirlin et al. | |
| 5,637,533 A | 6/1997 | Choi | |
| 5,695,810 A | 12/1997 | Dubin et al. | |
| 5,711,811 A | 1/1998 | Suntola et al. | |
| 5,731,634 A | 3/1998 | Matsuo et al. | |
| 5,820,664 A | 10/1998 | Gardiner et al. | |

(Continued)

FOREIGN PATENT DOCUMENTS

DE          41 08 73         8/1923

(Continued)

OTHER PUBLICATIONS

Office Action dated Mar. 17, 2009 for U.S. Appl. No. 11/376,704, filed Mar. 14, 2006.

(Continued)

*Primary Examiner* — David Turocy
*Assistant Examiner* — Joseph Miller, Jr.
(74) *Attorney, Agent, or Firm* — Knobbe Martens Olson & Bear LLP

(57) ABSTRACT

The invention relates generally to processes for enhancing the deposition of noble metal thin films on a substrate by atomic layer deposition. Treatment with gaseous halides or metalorganic compounds reduces the incubation time for deposition of noble metals on particular surfaces. The methods may be utilized to facilitate selective deposition. For example, selective deposition of noble metals on high-k materials relative to insulators can be enhanced by pretreatment with halide reactants. In addition, halide treatment can be used to avoid deposition on the quartz walls of the reaction chamber.

43 Claims, 25 Drawing Sheets

U.S. PATENT DOCUMENTS

| | | | |
|---|---|---|---|
| 5,865,365 A | 2/1999 | Nishikawa et al. | |
| 5,874,600 A | 2/1999 | Rautenstrauch et al. | |
| 5,884,009 A | 3/1999 | Okase | |
| 5,916,365 A | 6/1999 | Sherman | |
| 5,923,056 A | 7/1999 | Lee et al. | |
| 5,939,334 A | 8/1999 | Nguyen et al. | |
| 5,989,672 A | 11/1999 | Hayashi | |
| 5,998,048 A | 12/1999 | Jin et al. | |
| 6,006,763 A | 12/1999 | Mori et al. | |
| 6,015,986 A | 1/2000 | Schuegraf | |
| 6,033,584 A | 3/2000 | Ngo et al. | |
| 6,040,243 A | 3/2000 | Li et al. | |
| 6,063,705 A | 5/2000 | Vaartstra | |
| 6,066,892 A | 5/2000 | Ding et al. | |
| 6,074,945 A | 6/2000 | Vaartstra et al. | |
| 6,108,937 A | 8/2000 | Raaijmakers | |
| 6,124,189 A | 9/2000 | Watanabe et al. | |
| 6,130,123 A | 10/2000 | Liang et al. | |
| 6,133,159 A | 10/2000 | Vaartstra et al. | |
| 6,136,163 A | 10/2000 | Cheung et al. | |
| 6,139,700 A | 10/2000 | Kang et al. | |
| 6,143,658 A | 11/2000 | Donnelly et al. | |
| 6,144,060 A | 11/2000 | Park et al. | |
| 6,171,910 B1 | 1/2001 | Hobbs et al. | |
| 6,203,613 B1 | 3/2001 | Gates et al. | |
| 6,268,291 B1 | 7/2001 | Andricacos et al. | |
| 6,270,572 B1 | 8/2001 | Kim et al. | |
| 6,281,125 B1 | 8/2001 | Vaartstra et al. | |
| 6,294,467 B1 | 9/2001 | Yokoyama et al. | |
| 6,297,539 B1 | 10/2001 | Ma et al. | |
| 6,303,500 B1 | 10/2001 | Jiang et al. | |
| 6,305,314 B1 | 10/2001 | Sneh et al. | |
| 6,306,756 B1 | 10/2001 | Hasunuma et al. | |
| 6,320,213 B1 | 11/2001 | Kirlin et al. | |
| 6,323,131 B1 | 11/2001 | Obeng et al. | |
| 6,335,280 B1 | 1/2002 | Van der Jeugd | |
| 6,342,277 B1 | 1/2002 | Sherman | |
| 6,346,151 B1 | 2/2002 | Jiang et al. | |
| 6,359,159 B1 | 3/2002 | Welch et al. | |
| 6,380,080 B2 | 4/2002 | Visokay | |
| 6,391,785 B1 | 5/2002 | Satta et al. | |
| 6,395,650 B1 | 5/2002 | Callegari et al. | |
| 6,403,414 B2 | 6/2002 | Marsh | |
| 6,404,191 B2 | 6/2002 | Daughton et al. | |
| 6,420,189 B1 | 7/2002 | Lopatin | |
| 6,433,432 B2 | 8/2002 | Shimizu | |
| 6,444,568 B1 | 9/2002 | Sundararajan et al. | |
| 6,444,868 B1 | 9/2002 | Vaughn et al. | |
| 6,455,424 B1 | 9/2002 | McTeer et al. | |
| 6,464,779 B1 | 10/2002 | Powell et al. | |
| 6,475,276 B1 | 11/2002 | Elers et al. | |
| 6,478,931 B1 | 11/2002 | Wadley et al. | |
| 6,482,733 B2 | 11/2002 | Raaijmakers et al. | |
| 6,511,539 B1 | 1/2003 | Raaijmakers | |
| 6,534,395 B2 | 3/2003 | Werkhoven et al. | |
| 6,537,461 B1 | 3/2003 | Nakahara et al. | |
| 6,541,067 B1 | 4/2003 | Marsh et al. | |
| 6,551,399 B1 | 4/2003 | Sneh et al. | |
| 6,576,053 B1 | 6/2003 | Kim et al. | |
| 6,586,330 B1* | 7/2003 | Ludviksson et al. | 438/643 |
| 6,593,656 B2 | 7/2003 | Ahn et al. | |
| 6,617,173 B1 | 9/2003 | Shen | |
| 6,649,091 B2 | 11/2003 | Ryan et al. | |
| 6,656,748 B2 | 12/2003 | Hall et al. | |
| 6,664,192 B2 | 12/2003 | Satta et al. | |
| 6,679,951 B2 | 1/2004 | Soininen et al. | |
| 6,680,540 B2 | 1/2004 | Nakano et al. | |
| 6,703,708 B2 | 3/2004 | Werkhoven et al. | |
| 6,713,381 B2 | 3/2004 | Barr et al. | |
| 6,720,262 B2 | 4/2004 | Koh et al. | |
| 6,759,325 B2 | 7/2004 | Raaijmakers et al. | |
| 6,777,331 B2 | 8/2004 | Nguyen | |
| 6,784,101 B1 | 8/2004 | Yu et al. | |
| 6,784,504 B2 | 8/2004 | Derderian et al. | |
| 6,800,542 B2 | 10/2004 | Kim | |
| 6,800,567 B2 | 10/2004 | Cho et al. | |
| 6,824,816 B2 | 11/2004 | Aaltonen | |
| 6,842,740 B1 | 1/2005 | Jeran et al. | |
| 6,849,122 B1 | 2/2005 | Fair | |
| 6,852,635 B2 | 2/2005 | Satta et al. | |
| 6,878,628 B2 | 4/2005 | Sophie et al. | |
| 6,881,260 B2 | 4/2005 | Marsh et al. | |
| 6,881,437 B2 | 4/2005 | Ivanov et al. | |
| 6,887,795 B2 | 5/2005 | Soininen et al. | |
| 6,921,712 B2 | 7/2005 | Soininen et al. | |
| 6,933,225 B2 | 8/2005 | Werkhoven et al. | |
| 6,936,535 B2 | 8/2005 | Kim et al. | |
| 6,955,986 B2 | 10/2005 | Li | |
| 6,984,591 B1 | 1/2006 | Buchanan et al. | |
| 7,011,981 B2 | 3/2006 | Kim et al. | |
| 7,067,407 B2 | 6/2006 | Kostamo et al. | |
| 7,105,054 B2 | 9/2006 | Lindfors | |
| 7,107,998 B2 | 9/2006 | Greet et al. | |
| 7,118,779 B2 | 10/2006 | Verghese et al. | |
| 7,135,207 B2 | 11/2006 | Min et al. | |
| 7,183,604 B2 | 2/2007 | Cartier | |
| 7,211,509 B1* | 5/2007 | Gopinath et al. | 438/650 |
| 7,220,451 B2 | 5/2007 | Aaltonen et al. | |
| 7,220,669 B2 | 5/2007 | Hujanen et al. | |
| 7,241,677 B2 | 7/2007 | Soininen et al. | |
| 7,256,144 B2 | 8/2007 | Koyanagi et al. | |
| 7,273,526 B2 | 9/2007 | Shinriki et al. | |
| 7,273,814 B2 | 9/2007 | Matsuda | |
| 7,300,873 B2 | 11/2007 | Millward | |
| 7,361,544 B2 | 4/2008 | Yeom et al. | |
| 7,404,985 B2 | 7/2008 | Chang et al. | |
| 7,419,903 B2 | 9/2008 | Haukka et al. | |
| 7,435,484 B2 | 10/2008 | Shinriki et al. | |
| 7,438,949 B2 | 10/2008 | Weidman | |
| 7,476,618 B2 | 1/2009 | Kilpela et al. | |
| 7,494,927 B2 | 2/2009 | Kostamo et al. | |
| 7,541,284 B2 | 6/2009 | Park | |
| 7,601,223 B2 | 10/2009 | Lindfors et al. | |
| 7,666,773 B2 | 2/2010 | Huotari et al. | |
| 7,754,577 B2 | 7/2010 | Kim et al. | |
| 2001/0003064 A1 | 6/2001 | Ohto | |
| 2001/0013617 A1 | 8/2001 | Toyoda et al. | |
| 2001/0018266 A1 | 8/2001 | Jiang et al. | |
| 2001/0024387 A1* | 9/2001 | Raaijmakers et al. | 365/200 |
| 2001/0030366 A1 | 10/2001 | Nakano et al. | |
| 2001/0041250 A1* | 11/2001 | Werkhoven et al. | 428/212 |
| 2001/0052318 A1 | 12/2001 | Jiang et al. | |
| 2002/0004293 A1 | 1/2002 | Soininen et al. | |
| 2002/0006711 A1 | 1/2002 | Yamazaki et al. | |
| 2002/0013487 A1 | 1/2002 | Norman et al. | |
| 2002/0027286 A1 | 3/2002 | Sundararajan et al. | |
| 2002/0064948 A1 | 5/2002 | Saito et al. | |
| 2002/0102838 A1 | 8/2002 | Paranjpe et al. | |
| 2002/0146513 A1* | 10/2002 | Jin et al. | 427/255.28 |
| 2002/0173054 A1 | 11/2002 | Kim | |
| 2003/0013302 A1 | 1/2003 | Nguyen et al. | |
| 2003/0059535 A1* | 3/2003 | Luo et al. | 427/255.28 |
| 2003/0080363 A1 | 5/2003 | Maruyama et al. | |
| 2003/0088116 A1 | 5/2003 | Kawano et al. | |
| 2003/0100162 A1* | 5/2003 | Joo | 438/396 |
| 2003/0121608 A1 | 7/2003 | Chen et al. | |
| 2003/0135061 A1 | 7/2003 | Norman et al. | |
| 2003/0165615 A1* | 9/2003 | Aaltonen et al. | 427/79 |
| 2003/0214043 A1 | 11/2003 | Saitoh et al. | |
| 2003/0219991 A1 | 11/2003 | Geusic et al. | |
| 2003/0233976 A1 | 12/2003 | Marsh et al. | |
| 2004/0005753 A1 | 1/2004 | Kostamo et al. | |
| 2004/0028952 A1* | 2/2004 | Cartier et al. | 428/698 |
| 2004/0038529 A1 | 2/2004 | Soininen et al. | |
| 2004/0041194 A1 | 3/2004 | Marsh et al. | |
| 2004/0053496 A1 | 3/2004 | Choi | |
| 2004/0082125 A1 | 4/2004 | Hou et al. | |
| 2004/0087143 A1 | 5/2004 | Norman et al. | |
| 2004/0095792 A1 | 5/2004 | Herrmann et al. | |
| 2004/0105934 A1 | 6/2004 | Chang et al. | |
| 2004/0118697 A1 | 6/2004 | Wen et al. | |
| 2004/0126944 A1 | 7/2004 | Rotondaro et al. | |
| 2004/0142558 A1 | 7/2004 | Granneman | |
| 2004/0152255 A1 | 8/2004 | Seidl et al. | |
| 2004/0192021 A1 | 9/2004 | Li | |
| 2004/0192036 A1 | 9/2004 | Koyanagi et al. | |
| 2004/0214354 A1* | 10/2004 | Marsh et al. | 438/3 |

| | | | | | | |
|---|---|---|---|---|---|---|
| 2004/0216668 | A1 | 11/2004 | Lindfors et al. | KR | 2001-0004719 | 1/2001 |
| 2004/0221807 | A1 | 11/2004 | Verghese et al. | KR | 10-2001-0096408 | 11/2001 |
| 2004/0224475 | A1 | 11/2004 | Lee et al. | KR | 10-2001-0112889 | 12/2001 |
| 2005/0009325 | A1 | 1/2005 | Chung et al. | KR | 10-2003-0011399 | 2/2003 |
| 2005/0020060 | A1 | 1/2005 | Aaltonen et al. | KR | 10-2005-0103373 | 10/2005 |
| 2005/0048794 | A1 | 3/2005 | Brask et al. | WO | WO 93/10652 | 5/1993 |
| 2005/0064207 | A1 | 3/2005 | Senzaki et al. | WO | WO 98/01890 | 1/1998 |
| 2005/0082587 | A1 | 4/2005 | Marsh | WO | WO 99/17343 | 4/1999 |
| 2005/0085031 | A1 | 4/2005 | Lopatin et al. | WO | WO 00/03420 | 1/2000 |
| 2005/0087879 | A1 | 4/2005 | Won et al. | WO | WO 00/38191 | 6/2000 |
| 2005/0089632 | A1 | 4/2005 | Vehkamaki et al. | WO | WO 01/50502 | 7/2001 |
| 2005/0092247 | A1 | 5/2005 | Schmidt et al. | WO | WO 01/88972 | 11/2001 |
| 2005/0095781 | A1 | 5/2005 | Papa Rao et al. | WO | WO 02/09126 | 1/2002 |
| 2005/0098440 | A1 | 5/2005 | Kailasam et al. | WO | WO 02/09158 | 1/2002 |
| 2005/0118807 | A1* | 6/2005 | Kim et al. ............... 438/686 | WO | WO 03/023835 | 3/2003 |
| 2005/0124154 | A1 | 6/2005 | Park et al. | WO | WO 03/040150 | 5/2003 |
| 2005/0181555 | A1 | 8/2005 | Haukka et al. | WO | WO 03/056612 | 7/2003 |
| 2005/0208754 | A1 | 9/2005 | Kostamo et al. | WO | WO 2004 035858 | 4/2004 |
| 2005/0229848 | A1 | 10/2005 | Shinriki et al. | WO | WO 2006/035281 | 4/2006 |
| 2005/0238808 | A1 | 10/2005 | Gatineau et al. | WO | WO 2006/035281 A1 | 4/2006 |
| 2005/0266700 | A1 | 12/2005 | Jursich et al. | WO | WO 2009/146870 | 12/2009 |
| 2005/0271812 | A1* | 12/2005 | Myo et al. ............... 427/248.1 | | | |
| 2006/0013955 | A1 | 1/2006 | Senzaki | | | |
| 2006/0019495 | A1 | 1/2006 | Marcadal et al. | | | |
| 2006/0035462 | A1 | 2/2006 | Millward | | | |
| 2006/0063375 | A1 | 3/2006 | Sun et al. | | | |
| 2006/0073276 | A1 | 4/2006 | Antonissen | | | |
| 2006/0093848 | A1 | 5/2006 | Senkevich et al. | | | |
| 2006/0118968 | A1 | 6/2006 | Johnson et al. | | | |
| 2006/0121733 | A1 | 6/2006 | Kilpela et al. | | | |
| 2006/0128150 | A1 | 6/2006 | Gandikota et al. | | | |
| 2006/0137608 | A1 | 6/2006 | Choi et al. | | | |
| 2006/0165892 | A1 | 7/2006 | Weidman | | | |
| 2006/0177601 | A1 | 8/2006 | Park et al. | | | |
| 2006/0211228 | A1 | 9/2006 | Matsuda | | | |
| 2006/0216932 | A1 | 9/2006 | Kumar et al. | | | |
| 2006/0223300 | A1 | 10/2006 | Simka et al. | | | |
| 2006/0263977 | A1 | 11/2006 | Kim et al. | | | |
| 2007/0014919 | A1 | 1/2007 | Hamalainen et al. | | | |
| 2007/0026654 | A1 | 2/2007 | Huotari et al. | | | |
| 2007/0036892 | A1 | 2/2007 | Haukka et al. | | | |
| 2007/0059502 | A1 | 3/2007 | Wang et al. | | | |
| 2007/0082132 | A1 | 4/2007 | Shinriki et al. | | | |
| 2007/0099375 | A1 | 5/2007 | Kim et al. | | | |
| 2007/0148897 | A1 | 6/2007 | Yeom et al. | | | |
| 2007/0190782 | A1 | 8/2007 | Park | | | |
| 2008/0038465 | A1 | 2/2008 | Dussarrat | | | |
| 2008/0054472 | A1 | 3/2008 | Shinriki et al. | | | |
| 2008/0124484 | A1 | 5/2008 | Shinriki et al. | | | |
| 2008/0146042 | A1 | 6/2008 | Kostamo et al. | | | |
| 2008/0171436 | A1 | 7/2008 | Koh et al. | | | |
| 2008/0200019 | A9 | 8/2008 | Huotari et al. | | | |
| 2008/0206982 | A1 | 8/2008 | Suzuki | | | |
| 2008/0214003 | A1 | 9/2008 | Xia | | | |
| 2008/0296768 | A1 | 12/2008 | Chebiam | | | |
| 2008/0315418 | A1 | 12/2008 | Boyd | | | |
| 2008/0318417 | A1 | 12/2008 | Shinriki et al. | | | |
| 2009/0068832 | A1 | 3/2009 | Haukka et al. | | | |
| 2009/0087339 | A1 | 4/2009 | Shinriki | | | |
| 2009/0104777 | A1 | 4/2009 | Kim | | | |
| 2009/0155997 | A1 | 6/2009 | Shinriki | | | |
| 2009/0163024 | A1 | 6/2009 | Kim et al. | | | |
| 2009/0209101 | A1 | 8/2009 | Shinriki et al. | | | |
| 2010/0055433 | A1 | 3/2010 | Shinriki et al. | | | |
| 2010/0099904 | A1 | 4/2010 | Dupau et al. | | | |

FOREIGN PATENT DOCUMENTS

| | | |
|---|---|---|
| DE | 10 2008 026 284 | 12/2009 |
| EP | 0 469 470 A1 | 2/1992 |
| EP | 0 469 456 | 5/1992 |
| EP | 0 880 168 A2 | 11/1998 |
| EP | 1 688 923 | 8/2006 |
| GB | 368 850 | 12/1930 |
| GB | 1 518 243 | 7/1978 |
| GB | 2 340 508 A | 2/2000 |
| JP | 10-340994 | 12/1998 |
| JP | 2003-168738 | 6/2003 |
| KR | 2001-0004717 | 1/2001 |
| KR | 2001-0004718 | 1/2001 |

OTHER PUBLICATIONS

Aaltonen et al., "Atomic Layer Deposition of Platinum Thin Films," Chem. Mater. 15: 1924-1928 (2003).

Aaltonen et al., "Atomic Layer Deposition of Noble Metal Thin Films," dissertation presented at the University of Helsinki, Helsinki, Finland, 2005.

Baliga, J., "New Designs and Materials Tackle 1 Gb Memory Challenge," Semiconductor International, World Wide Web address: semiconductor.net, Nov. 2000.

Basceri, C., "Electrial Dielectric Properties of (Ba,Sr) $TiO_3$ Thin Film Capacitors for Ultra-High Density Dynamic Random Access Memories", Thesis, 1997.

Kwon et al., "Ruthenium Bottom Electrode Prepared by Electroplating for a High Density DRAM Capacitor," J. Electrochem. Soc. 151(2): C127-C132 (2004).

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

SOI Technology: IMB's Next Advance in Chip Design, 1998.

T. Aaltonen et al. "Reaction Mechanism Studies on Atomic Layer Deposition of Ruthenium and Platinum," Electrochem. Solid-State Lett., 6 (2003), C130-133.

T. Aaltonen et al. "Atomic Layer Deposition of Ruthenium Thin Films from Ru(thd)3 and Oxygen," Chem. Vap. Deposition, 10, pp. 25-219, 2004.

T. Aaltonen et al., Atomic Layer Deposition of Noble Metals: Exploration of the low limit of the deposition temperature, J. Mater. Res., vol. 19, No. 11, 2004.

Lee et al., "Electroless CoWP boosts cooper reliability, device performance," Semiconductor International, Jul. 1, 2004, 5 pages.

Paranjpe, Atomic Layer Deposition of AlOx for thin Film Head Gap Applications, Journal of Electrochemical Society, V 148 (9), G465-G471, 2001.

The File Wrapper for U.S. Appl. No. 11/376,704, filed Mar. 14, 2006, titled "Selective Deposition of Noble Metal Thin Films", listing as inventor Huotari et al.

Office Action for U.S. Appl. No. 11/376,704, filed Mar. 14, 2006, dated Oct. 20, 2008.

Office Action for U.S. Appl. No. 11/376,704, filed Mar. 14, 2006, dated Feb. 25, 2008.

The File Wrapper for U.S. Appl. No. 11/182,734, filed Jul. 15, 2005, titled "Atomic Layer Deposition of Noble Metal Oxides", listing as inventor Hamalainen et al.

Office Action for U.S. Appl. No. 11/182,734, filed Jul. 15, 2005, dated Aug. 21, 2008.

Office Action for U.S. Appl. No. 11/182,734, filed Jul. 15, 2005, dated Dec. 29, 2008.

U.S. Appl. No. 10/782,727, filed Feb. 18, 2004, Lindfors et al.

U.S. Appl. No. 11/254,071, filed Oct. 18, 2005, Helsinki.

U.S. Appl. No. 11/367,177, filed Mar. 3, 2006, Shinriki et al.

U.S. Appl. No. 11/469,828, filed Sep. 1, 2009, Shinriki et al.

U.S. Appl. No. 11/557,891, filed Nov. 8, 2006, Shinriki et al.
U.S. Appl. No. 11/955,275, filed Dec. 12, 2007, Shinriki.
U.S. Appl. No. 11/972,081, filed Jan. 10, 2008, Koh.
U.S. Appl. No. 12/129,345, filed May 29, 2008, Shinriki et al.
U.S. Appl. No. 12/201,434, filed Aug. 29, 2008, Shinriki et al.
U.S. Appl. No. 12/337,141, filed Dec. 17, 2008, Kim et al.
U.S. Appl. No. 60/976,378, filed Sep. 28, 2007, Shinriki, H.
U.S. Appl. No. 61/178,871, filed May 15, 2009, Hamalainen et al.
Aaltonen et al., "ALD of Rhodium Thin Films from Rh (acac)$_3$ and Oxygen," Electrochem. Solid-State Letters 8 (8): C99-C101 (2005).
Aaltonen et al., "Atomic Layer Deposition of Iridium Thin Films," Journal of The Electrochemical Society 151(8): G489-G492 (2004).
Aaltonen et al., "Ruthenium Thin Film Grown by Atomic Layer Deposition," Chem. Vap. Deposition, 9[1], 45, 2003.
Akerman et al., "Identifying Tunneling in Ferromagnetic-Insulator-Ferromagnetic Thin Film Structures," World Wide Web, physics.ucsd.ediuksgrp/Tunneling.html, pp. 1-7.
Addison et al., "The Vapour Pressure of Anhydrous Copper Nitrate, and its Molecular Weight in the Vapour State," J. Chem. Soc., pp. 3099-3106 (1958).
Aoyama et al., "Chemical Vapor Deposition of Ru and Its Application in (Ba,Sr) TiO$_3$ Capacitors for Future Dynamic Random Access Memories," Jpn. J. Appl. Phys. 38(43): 2194-2199 (1999).
Aoyama et al., "Ruthenium Films Prepared by Liquid Source Chemical Vapor Deposition Using Bis-(ethylcyclopentadienyl)ruthenium". Jpn. J. Appl. Phys., vol. 38 (1999) pp. L1134-L1136.
Arnal et al., "Materials and Processes for High Signal Propagation Performance and Reliable 32 nm Node BEOL.," 1-4244-1069-X/07, 2007 IEEE, pp. 1-3.
Baklanov et al., "Characterization of Cu surface Cleaning by Hydrogen Plasma," Journal Vac. Sci. Technol 19(4): 1201-1211 (2001).
Bobo et al., "Spin Dependent Tunneling Junctions with Hard Magnetic Layer Pinning," Journal of Applied Physics, vol. 83. No. 11, pp. 6685-6687, (1998).
Bursky, "Hit Up IEDM for Gigabit and Denser DRAMs and Merged Logic/Memory," Electronic Design, World Wide Web address: planetee.com, Dec. 1, 1998.
Campbell et al., "Titanium Dioxide (TiO$_2$)-Based Gate Insulators," IBM J. Res. Develop., May 1999, pp. 383-392, vol. 43, No. 3.
Daughton, World Wide Web nve.com/otherbiz/mram2.pdf, "Advanced MRAM Concepts," p. 1-6, (Feb. 7, 2001).
Fereday et al., "Anhydrous Cobalt (III) Nitrate," Chemical Communications, p. 271 (1968).
Fukuzumi et al., "Liner-Supported Cylinder (LSC) Technology to Realize Ru/Ta$_2$O$_5$/Ru Capacitor for Future DRAMs," IEEE, IED 2000, Session 34 (2000).
Fullerton et al., "Advanced Magnetic Recording Media for High-Density Data," Solid State Technology 44(i9): 87 (2001).
Hones et al., "MOCVD of Thin Ruthenium Oxide Films: Properties and Growth Kinetics," Chem. Vap. Deposition 6(4): 193-198 (2000).
Hoyas et al., "Growth and Characterization of Atomic Layer Deposited WC0.7N0.3 on Polymer Films," Journal of Applied Physics, Jan. 1, 2004, vol. 95, Issue 1, pp. 381-388.
Hu et al., "In situ Rapid Thermal Oxidation and Reduction of Copper Thin Films and their Applications in Ultralarge Scale Integration," Journal of The Electrochemical Society 148(12): G669-G675 (2001).
Hur'Yeva et al., "Ruthenium Films Deposited by Liquid-Delivery MOCVD using Bis(ethylcyclopentadienyl)ruthenium with Toulene as the Solvent," Chemical Vapor Deposition 2006, 12, pp. 429-434.
Imai, World Wide Web nikkeibp.asiabiztech.com/nea/200008/tech_108675.html, "100 Gbit/Inch HDD Just Around the Corner," p. 1-6, (Aug. 2000).
Inoue et al., "Low Thermal-Budget Fabrication of Sputtered-PZT Capacitor on Multilevel Interconnects for Embedded FeRAM," IEEE, IED 2000, 2000, Session 34.
Integrated Circuit Engineering Corporation, Practical Integrated Circuit Fabrication Seminar (1998).
Jung et al., "A Novel Ir/IrO$_2$/Pt-PZT-Pt/IrO2/Ir Capacitor for a Highly Reliable Mega-Scale FRAM," IEEE, IED 2000, Session 34 (2000).
Kadota et al., "Ruthenium Films Deposited under H$_2$ by MOCVD using a Novel Liquid Precursor," IEEE article, pp. 175-176, no date available.

Kawamoto et al., "The Outlook for Semiconductor Processes and Manufacturing Technologies in the 0.1-μm Age," Hitachi Review 48(6): 334-339 (1999).
Koh et al., U.S. Appl. No. 11/972,081, filed Jan. 10, 2008.
Kwon et al., "Plasma-Enhanced Atomic Layer Deposition of RuTiN Thin Films for the Application of Copper Diffusion Barrier," ALD Conference, 2004.
Kwon, et al., "Plasma-Enhanced Atomic Layer Deposition of Ruthenium Thin Films," Electrochemical and Solid-State Letters, 7(4), C46-C48 (2004).
Namba et al., PEALD of Ru Layer on WNC ALD Barrier for Cu/Porous Low-k, Proceedings of Advanced Metallization Conference 2006, p. 39.
NEC Device Technology International, "Current State of Leading Edge ULSI Process Technology and Future Trends," No. 48, pp. 4-8 (1998).
Nilsen et al., "Thin Film Deposition of Lanthanum Manganite Perovskite by the ALE process," Journal of Materials Chemistry, vol. 9, 1781-1784, (1999).
Onda et al., "DC-Hydrogen Plasma Cleaning a Novel Process for IC-Packaging," SEMICON WEST 97, Packaging Materials Conference, 1997, pp. D-1-D-3.
Onda et al., "Hydrogen Plasma Cleaning a Novel Process for IC-Packaging," p. 311, World Wide Web Address: SemiconductorFabtech.com, 1998.
Pakrad, "Pure Tech: Growth of MR/GMR Head Materials," World Wide Web, Puretechinc.com/tech_papers/tech_papers-4.htm, pp. 1-2, (1999).
Park et al., "Metallorganic Chemical Vapor Deposition of Ru and RuO$_2$ Using Ruthenocene Precursor and Oxygen Gas," J.Electrochem. Soc., 147[1], 203, 2000.
Ritala et al., "Atomic Layer Deposition," Handbook of Thin Film Materials vol. 1: Deposition and Processing of Thin Films, chapter 2, pp. 103-159 (2002).
Rossnagel, "The latest on Ru-Cu Interconnect Technology," Solid State Technology, Feb. 2005, Online, pp. 1-4.
Sakurai et al., "Adsorption of Ruthenium Tetroxide on Metal Surfaces," J. Phys. Chem. American Chemical Society, vol. 89, (1985).
Satta et al., "The Removal of Copper Oxides by Ethyl Alcohol Monitored in Situ by Spectroscopic Ellipsometry," Journal of the Electromechanical Society, 150 (5) , pp. 300-306 (2003).
Shao et al., "An Alternative Low Resistance MOL Technology with Electroplated Rhodium as Contact Plugs for 32nm CMOS and Beyond," 1-4244-1070-3/07, 2007 IEEE.
Shinriki et al., "Method for Forming Ruthenium Complex Film using B-Diketone-Coordinated Ruthenium Precursor," U.S. Appl. No. 12/203,405, filed Sep. 3, 2008.
Shinriki et al., "Ruthenium Alloy Film for Copper Interconnects," U.S. Appl. No. 12/129,345, filed May 29, 2008.
Shinriki et al., "Atomic Composition Controlled Ruthenium Alloy Film Formed by Plasma-Enhanced Atomic Layer Deposition," U.S. Appl. No. 12/201,434, filed Aug. 29, 2008.
Shinriki et al., "Method for Forming TA-RU Liner Layer for CU Wiring," U.S. Appl. No. 11/955,275, filed Dec. 12, 2007.
Singer, "Progress in Copper: A Look Ahead", Semiconductor International, May 1, 2002.
Solanki et al., "Atomic Layer Deposition of Copper Seed Layers," Electrochemical and Solid-State Letters 3(10): 479-480 (2000).
Sundani et al., "Oral Presentation of Dual Damascene Process," slides, Nov. 19, 1998.
Suntola et al., "Atomic Layer Epitaxy," Handbook of Crystal Growth, vol. 3, chapter 14, pp. 601-663 (1994).
Tung et al., Atomic Layer Deposition of Noble Metals: Exploration of the Low Limit of the Deposition Temeratrue, Nov. 2004, J. Mater. Res., vol. 19, No. 11, pp. 3353-3357.
Ueno et al., "Cleaning of CHF$_3$ Plasma-Etched SiO$_2$/SiN/Cu via Structures Using a Hydrogen Plasma, an Oxygen Plasma and Hexafluoracetylacetone Vapors," J. Vac. Sci. Technology B vol. 16, No. 6, pp. 2986-2995 (1998).
Utriainen et al., "Studies of Metallic Thin Film Growth in an Atomic Layer Epitaxy Reactor Using M(acac)$_2$ (M=Ni, Cu, Pt) Precursors," Applied Surface Science 157: 151-158 (2000).

Utriainen et al., "Studies of NiO Thin Film Formation by Atomic Layer Epitaxy," Materials Science and Engineering B54: 98-103 (1998).

Wang, "Advanced Materials for Extremely High Density Magnetic Recording Heads," Department of Materials Science and Engineering, Department of Electrical Engineering, Stanford University, Stanford, CA 94305-4045, presentation, 1999.

Winbond News Release, "Successful Development of Capacitor Technology for Next Generation Memory," World Wide Web address: winbond.com, Dec. 13, 2000.

Won et al., "Conformal CVD-Ruthenium Process for MIM Capacitor in Giga-Bit DRAMs," IEEE, IED 2000, Session 34 (2000).

World Wide web, magahaus.com/tech/westerndigital/shitepapers/gmr_wp.shtml, "GMR Head Technology: Increased Areal Density and Improved Performance," pp. 1-, (Feb. 2000).

World Wide Web, pc.guide.com/ref/hdd/op/heads/techGMR-c.html, "Giant Magnetoresistive (GMR) Heads," pp. 1-4, 2001.

World Wide web, semiconductor.net/semiconductor/issues/Issues/1998/feb98/docs/emerging.asp, "GMR Read-Write Heads Yield Data Storage Record," (Feb. 1998).

World Wide Web, stoner.leeds.ac.uk/research/gmr.htm, "Giant Magnetoresistance," pp. 1-8.

Xu et al., "A Breakthrough in Low-k Barrier/Etch Stop Films for Copper Damascene Applications," Semiconductor Fabtech, 2000, pp. 239-244, 11th Edition.

Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.

Yang et al., "Physical, Electrical, and Relaiability Characterization of Ru for Cu Interconnects," 2006 International Interconnect Technology Conference, pp. 187-189, ISBN 1-4244-0103-8/06, 2006 IEEE.

Yoon et al., "Development of an RTA Process for the Enhanced Crystallization of Amorphous Silicon Thin Film," Electrochemical Society Proceedings Sep. 2000: 337-343 (2000).

Yoon et al., "Investigation of $RuO_2$-Incorporated Pt Layer as a Bottom Electrode and Diffusion Barrier for High Epsilon Capacitor Applications," Electrochemical and Solid-State Letters 3(8): 373-376 (2000).

Yoon et al., "Tantalum-Ruthenium Dioxide as a Diffusion Barrier Between Pt bottom Electrode and $TiSi_2$ Ohmic Contact Layer for High Density Capacitors," Journal of Applied Physics 86(5): 2544-2549 (1999).

Yoon et al., $197^{th}$ Meeting Program Information II, The Electrochemical Society, $197^{th}$ Meeting—Toronto, Ontario, Canada, May 14-18, 2000, Program Information, I1—Rapid Thermal and Other Short-Time Processing Technologies I, Electronics Division/Dielectric Sciende and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoon, T.-K. Kim, K.-B. Kim J.-Y. Chio, B.-I. Lee, and S.-K. Joo (Seoul National Univ.).

Kawaguchi, MPEG1 Decoder LSI for Video CD mPD61012NEC Device Technology International, NEC Device Technology International, New Products, Jan. 1998, vol. 5, Issue 48, pp. 4-8.

Office Action dated Mar. 17, 2009 for U.S. Appl. No. 11/182,734, filed Jul. 15, 2005.

Office Action dated Sep. 24, 2009 for U.S. Appl. No. 11/182,734, filed Jul. 15, 2005.

Office Action dated May 17, 2010 for U.S. Appl. No. 11/182,734, filed Jul. 15, 2005.

Office Action dated Oct. 27, 2010 for U.S. Appl. No. 11/182,734, filed Jul. 15, 2005.

U.S. Appl. No. 10/728,126, filed Dec. 3, 2003, Ernst H.A. Granneman.

Final Office Action for U.S. Appl. No. 11/376,704, filed Mar. 14, 2006, dated Mar. 5, 2009.

Notice of Allowance for U.S. Appl. No. 11/376,704, filed Mar. 14, 2006, dated May 15, 2009.

* cited by examiner

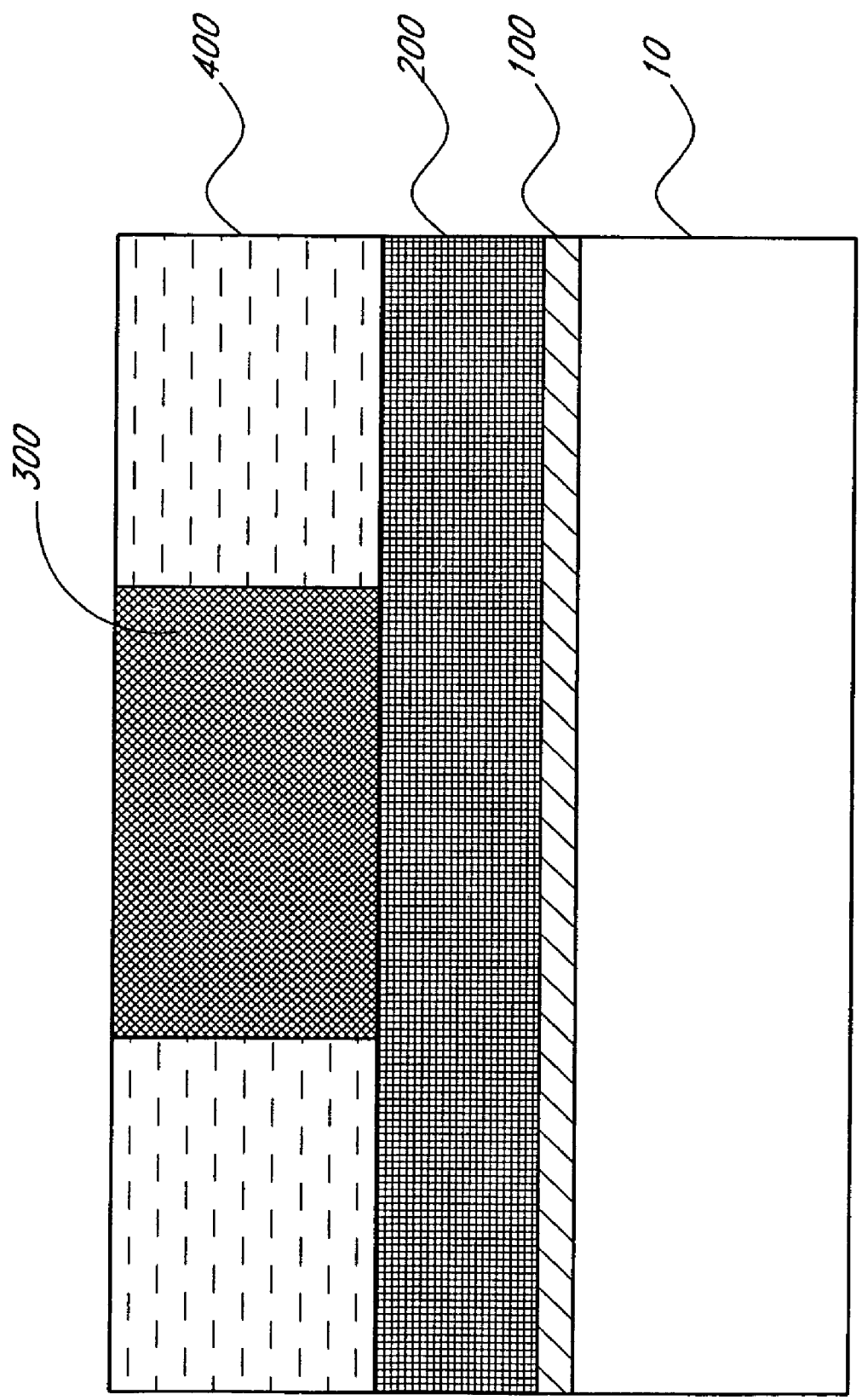

ENHANCED DEPOSITION OF NOBLE METALS

REFERENCE TO RELATED APPLICATIONS

The present application claims priority to U.S. Provisional Application No. 60/662,145, filed Mar. 15, 2005 and is related to U.S. Provisional Application No. 60/662,144, filed Mar. 15, 2005, each of which is incorporated herein by reference.

BACKGROUND OF THE INVENTION

1. Field of the Invention

Noble metal thin films can be deposited by vapor deposition processes, such as atomic layer deposition. Such films find use, for example, in integrated circuits and magnetic recording media.

2. Description of the Related Art

Thin films of ruthenium and other noble metals can be used in a wide variety of applications including integrated circuits and magnetic recording media. For example, noble metals such as ruthenium and metal alloys comprising noble metals, such as RuTa, may be used as an electrode material in transistors, particularly those where silicon oxide is replaced by high-k dielectrics. Noble metals can also be used as copper seed layers in metallization processes. Noble metals are advantageous because they tend not to oxidize or otherwise corrode.

Noble metal films can also be used for capacitor electrodes of dynamic random access memories (DRAMs) and are a potential electrode material for nonvolatile ferroelectric memories.

In addition to electrode applications, thin noble metal films find potential use in magnetic recording technology. In anti-ferromagnetically coupled recording media, for example, a thin Ru film may be used for separating two ferromagnetic layers.

Ruthenium and other noble metals can be deposited by atomic layer deposition (ALD) type processes. However, the incubation time for such processes varies depending on a number of factors including the composition of the surface on which the noble metal is being deposited. In particular on metal oxides and metal nitrides, the incubation time can be long. For example, on $SiO_2$ the incubation time can be as much as 300-400 ALD cycles. The long incubation time uses up expensive noble metal precursor and increases processing time. This can be a particular problem in the deposition of noble metal films in an ALD batch system, where 50-100 wafers are processed at the same time.

Plasma enhanced ALD (PEALD) has been shown to decrease the incubation time for depositing noble metals on a WNC surface. Unfortunately the PEALD process can not be used to deposit metal gates due to harmful effects of the direct plasma on the high-k gate oxide. Further, in the case of the deposition over structures with a high step coverage, such as inside deep and narrow capacitor containers or trenches, the life time of H radicals is too short to obtain a conformal noble metal film along the entire step.

High-k oxides can themselves be deposited using ALD prior to noble metal deposition. Generally, in the last ALD deposition cycle of a high-k oxide, such as hafnium or aluminum oxide, the outermost layer of metal precursor is converted to the corresponding oxide using an oxygen containing reactant, such as water or ozone, thus removing impurities from the high-k/noble metal interface.

SUMMARY OF THE INVENTION

Thin films of noble metals can be deposited by vapor deposition processes, such as atomic layer deposition (ALD) type processes. In some embodiments, in each ALD cycle the substrate is alternately contacted with a noble metal precursor and a second reactant, such that a thin noble metal film is formed on the substrate. The cycles are repeated until a thin film of the desired thickness has been deposited. In the preferred embodiments, the deposition process is enhanced by providing the substrate surface on which deposition is desired with a halide termination or another type of termination that enhances the film growth.

In one aspect of the invention, the substrate is treated with a halide or metalorganic reactant prior to beginning the vapor deposition process. The halide or metalorganic reactant is preferably different from the precursor used to deposit the noble metal. Preferably the halide is a metal halide or hydrogen halide. The substrate preferably comprises an oxide or nitride surface, more preferably a metal oxide or metal nitride surface. In some embodiments the substrate comprises an $Al_2O_3$ surface. In other embodiments the substrate comprises a $SiO_2$ surface. The surface treatment is preferably conducted at a temperature at which the surface on which deposition is desired is reactive with the halide. In some embodiments the surface treatment is conducted at a temperature at which a surface on which deposition is to be avoided does not react with the surface. That is, a temperature is selected in which surface treatment causes a first surface to have the desired termination while a second surface does not. In this way, selective deposition of a thin film comprising a noble metal can be achieved.

The treatment preferably comprises exposing the substrate to one or more gaseous halides and/or metalorganic compounds. The term "halide" is not limiting in any way and the halide can be any compound comprising a halogen (F, Cl, Br, I) atom. "Halides" can comprise metal halides as well as non-metal halides. A halide may be, for example, selected from the group consisting of HCl, $HfCl_4$, $SiCl_4$ and $AlCl_3$. Metalorganic compounds may be, for example and without limitation, metal alkylamide compounds like (tetrakis(ethylmethyl)aminohafnium, TEMAH) or metal alkyl compounds like trimethylaluminum (TMA). In some embodiments the halide and/or metalorganic compounds preferably do not comprise a noble metal.

In some embodiments, surface treatment is followed by an atomic layer deposition process. Preferably, the ALD process comprises alternating and sequential pulses of a noble metal precursor, such as a ruthenium precursor, and a second reactant, such as an oxygen precursor. The noble metal precursor is preferably a cyclopentadienyl or betadiketonate compound, more preferably an ethyl cyclopentadienyl compound, such as $Ru(EtCp)_2$, or an acetylacetonate (acac) compound, such as $Ir(acac)_3$. In a preferred embodiment, the process is a thermal ALD process. However, in some embodiments it can be a plasma enhanced ALD process.

In another aspect of the invention, deposition of noble metal on a substrate surface is facilitated while avoiding deposition on the quartz walls of the reaction chamber. Preferably, the substrate is treated with a gaseous halide reactant at a temperature at which a halide termination is formed on the surface of the substrate on which deposition is desired but not on the walls of the reaction chamber. ALD is then used to deposit a thin film comprising a noble metal on the substrate.

The thin film may be, for example, an elemental noble metal thin film, a compound film comprising one or more noble metals, or a nanolaminate comprising one or more noble metals. The temperature is preferably maintained at a level at which the noble metal does not deposit on $SiO_2$. Preferably the temperature is below about 400° C., more preferably below about 300° C., yet more preferably about from 250° to about 300° C.

In another aspect, a noble metal, such as ruthenium, is selectively on a high-k surface of a substrate relative to another surface, preferably a conventional silicon oxide or silicon nitride-based insulator surface. A substrate comprising a first high-k surface and a second insulator surface is exposed to a halide reactant. The temperature is preferably selected such that the halide preferentially reacts with the high-k surface compared to the insulator. A noble metal is then deposited, such as by an ALD process, and deposition is enhanced on the high-k material relative to the insulator. Preferably the temperature is selected such that deposition on the insulator is avoided.

In yet another aspect of the invention, vapor deposition process is used to deposit a noble metal, such as ruthenium, on a layer that was itself previously deposited by a vapor deposition process. In a preferred embodiment a noble metal is deposited on a high-k surface, such as hafnium oxide ($HfO_2$), where the high-k material was deposited by ALD. During the last high-k deposition cycle, the last metal reactant layer, for example a $HfCl_4$ or TEMAH layer, is not converted to the corresponding oxide (or other material). That is, the ligands terminating the last monolayer of metal containing reactant are not removed. Thus, the substrate surface comprises a surface termination that enhances noble metal deposition. For example, in some embodiments the metal precursor used to deposit a high-k material is a halide. After the last high k deposition cycle, the substrate will have a halide termination. In other embodiments, a metalorganic compound is used to deposit a high-k material and the top surface of the high k material is terminated with organic ligands after the final high k deposition cycle. In some embodiments, a high k material is deposited using TEMAH as the metal reactant and the upper surface has an alkylamide termination prior to noble metal deposition. A noble metal film is subsequently deposited on the surface, such as by ALD, and deposition is enhanced by the surface termination.

In a further aspect of the invention, methods for depositing noble-metal containing films, such as metal alloy, metal oxide, metal nitride or metal carbide films comprising one or more noble metals are provided, along with noble metal-containing films prepared by such methods. The methods preferably utilize the surface termination created from metal halide or metalorganic precursors. After contacting the substrate with a noble metal precursor, remaining halide or organic ligands are removed using one or more scavenging agents. Scavenging agents may include, for example, hydrogen, hydrogen plasma or radicals, nitrogen and hydrogen plasma or radicals or ammonia.

In one embodiment, a gate electrode is formed by depositing a gate dielectric layer and depositing a noble metal such as ruthenium over the gate dielectric layer by an atomic layer deposition process.

DETAILED DESCRIPTION OF THE PREFERRED EMBODIMENTS

Figure 1:
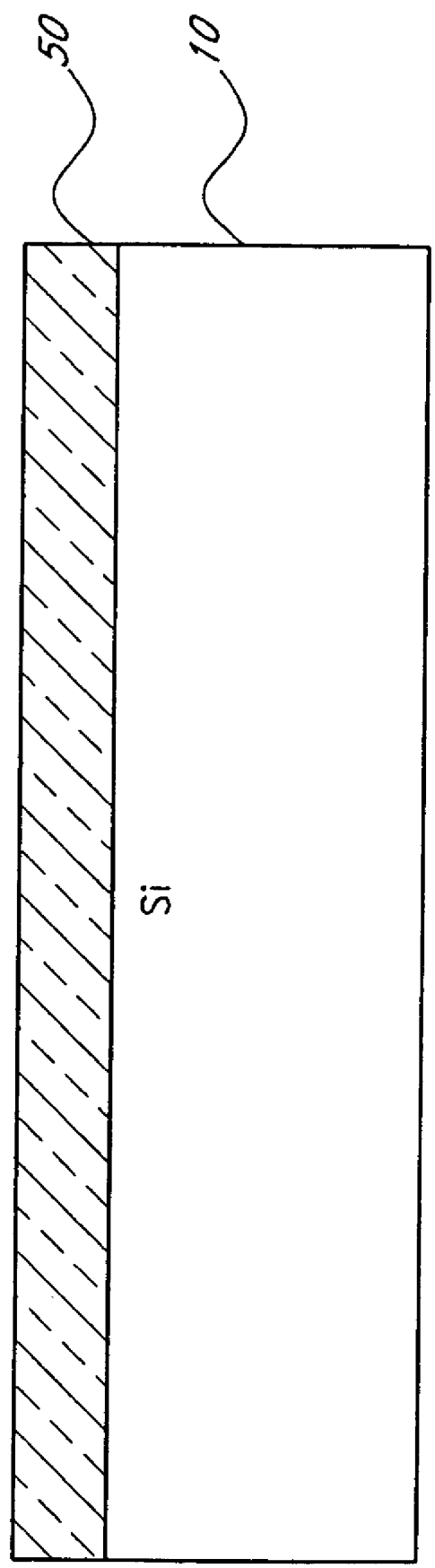
FIGS. 1-6 are schematic cross-sections of partially fabricated integrated circuits, illustrating a process flow for the formation of a gate electrode utilizing a selective noble metal deposition process.

Ruthenium thin films and thin films of other noble metals can be deposited on a substrate by vapor deposition processes, such as atomic layer deposition (ALD) type processes. However, as mentioned above, the incubation time for the deposition process will vary depending on a number of factors including the surface termination and the reaction temperature. In order to decrease incubation time, substrate surfaces can be modified. Preferably, the substrate surface is modified by exposure to a halide reactant. In other embodiments the substrate surface is modified by exposure to a metalorganic reactant. In addition to decreasing incubation time, surface modification can facilitate the selective deposition of noble metals on one surface relative to another. For example, a substrate can be treated with a halide or metalorganic reactant under conditions such that a high-k surface is modified but another surface on which deposition is to be avoided is not modified. The selectivity of the subsequent deposition of a noble metal for the high-k surface is thereby enhanced. This selective treatment can also be used to avoid deposition on reaction chamber walls.

Although generally described herein in relation to ALD processes, the skilled artisan will recognized that the surface treatment can be utilized to enhance the nucleation of noble metal reactants in other deposition processes, such as chemical vapor deposition (CVD) type processes. In addition to enhancing nucleation, surface treatment can allow lower deposition temperatures to be used and can allow for selective deposition on one surface relative to another. As in the ALD reactions described in detail herein, surface treatment, such as halide treatment for CVD, would include the provision of a halide or metalorganic reactant to the reaction space prior to the regular CVD process.

In a preferred embodiment, a metal oxide or metal nitride surface is modified to a metal halide surface prior to deposition of a noble metal by ALD. In other embodiments the surface is modified to a metalorganic surface. The metal halide or metalorganic surface is preferably more reactive with the noble metal precursor. Preferred noble metal precursors include cyclopentadienyl and betadiketonate noble metal compounds. The surface is preferably modified by treating it with a halide reactant or metalorganic reactant. For example, a substrate comprising a metal oxide or metal nitride surface may be exposed to a gaseous halide or metalorganic reactant. The halide or metalorganic reactant is preferably different from the noble metal precursor used in the subsequent deposition process.

ALD type processes are based on controlled, self-limiting surface reactions of the precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. This may be accomplished with an evacuation step and/or with an inactive gas pulse or purge.

Briefly, the substrate is loaded in a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

Prior to beginning the first cycle of the ALD noble metal process, the substrate is preferably treated with a halide compound or metalorganic compound. The halide or metalorganic compound is not limited in any way. The halide may comprise, for example and without limitation, an element selected from the group consisting of Sc, Ti, V, Fe, Cr, Mn, Zn, B, C, Al, Si, P, Zr, Nb, Mo, In, Ga, Ge, Sn, Hf, Ta and W. The halide may also be a non-metal halide, such as HCl or $PCl_5$. In some embodiments the halide is a chlorine compound and comprises at least one chlorine atom.

If a metalorganic compound is utilized for the surface treatment, it may comprise, for example and without limitation, an element selected from the group consisting of Sc, Ti, V, Fe, Cr, Mn, Zn, B, C, Al, Si, P, Zr, Nb, Mo, In, Ga, Ge, Sn, Hf, Ta and W, and one or more ligands selected from the group consisting of substituted or non-substituted alkyl-, alkylamide-, alkoxide-, amidinate-, aryl-, betadiketonate-, imido-amido- and cyclopentadienyl-compounds. In some embodiments, the metalorganic compounds are selected from the group consisting of trimethylaluminum, tetrakis(ethylmethyl)aminohafnium, tetrakis(dimethyl)aminohafnium, tetrakis(diethyl)aminohafnium, tetrakis(ethylmethyl)aminozirconium, tetrakis(dimethyl)aminozirconium and tetrakis(diethyl)aminozirconium.

In other embodiments, prior to beginning the first cycle of the ALD noble metal process, a metal, metal nitride, metal carbide, metal nitride carbide or metal oxide layer, preferably a high-k layer, such as $HfO_2$, is deposited on the substrate, preferably by ALD. As an example, $HfCl_4$ and $H_2O$, can be used as precursors for $HfO_2$ deposition in an ALD process. In the last deposition cycle, the outermost layer of adsorbed metal reactant is not converted to metal, metal nitride, metal carbide, metal nitride carbide or metal oxide. For example, in $HfO_2$ deposition by ALD using $HfCl_4$, the outermost layer of $HfCl_4$ is not converted to oxide with an oxidizing (e.g., $H_2O$) pulse. Thus, the substrate is left terminated with halide or organic ligands and the following noble metal deposition by ALD is enhanced.

Preferably, a vapor-phase halide or metalorganic compound is provided to the reaction chamber where it contacts the substrate. However, in some embodiments a liquid halide or metalorganic compound is utilized. For example, a liquid halide or metalorganic compound may be part of an etch solution, may be provide after etching or the substrate may be treated with a liquid halide or metalorganic compound in a separate step or in a different reactor which is capable of handling liquids.

The halide or metalorganic treatment is preferably conducted at a treatment temperature such that the halide or metalorganic reactants have sufficient vapor pressure but below the temperature at which they begin to decompose. In preferred embodiments the treatment temperature is between about 0° C. and about 1000° C., more preferably between about 100° C. and about 400° C. and still more preferably between about 150° C. and about 300° C.

The treatment temperature is also preferably selected to insure that the halide or metalorganic reactant reacts with the surface on which noble metal deposition is desired, leaving a halide or metalorganic termination on the surface. As a result, the treatment temperature may be different for deposition on different types of surfaces. For example, $SiO_2$ is less reactive with halide or metalorganic reactants such as HCl than $Al_2O_3$. Thus, the treatment temperature for enhancing ALD on $SiO_2$ will be higher than the treatment temperature for enhancing ALD on $Al_2O_3$. Preferably the treatment temperature for $SiO_2$ is greater than about 300° C.

If enhanced deposition on more than one surface is desired, the treatment temperature will preferably be high enough to provide a halide or metalorganic surface termination on the least reactive surface on which deposition is desired.

The treatment temperature is independent of the temperature at which the subsequent ALD cycles are carried out. However, the treatment temperature is preferably as close as possible to the deposition temperature.

In one embodiment, a surface to be deposited on comprises $SiO_2$. The treatment temperature is preferably above about 250° C., more preferably above about 300° C.

The halide or metalorganic compound may be, for example, a metal halide or a hydrogen halide or metalorganic compound. In some embodiments the halide is selected from the group consisting of HCl, $HfCl_4$ and $AlCl_3$. The halide or metalorganic compound can be selected by the skilled artisan based on its ability to react with the surface on which deposition is desired at an appropriate reaction temperature. The unreacted halide or metalorganic compound is removed from the reaction chamber prior to the first ALD cycle. The unreacted halide or metalorganic may be removed, for example, by purging with an inert gas and/or by evacuating the chamber.

The halide or metalorganic treatment may be provided a single time, or may be repeated multiple times. For example, alternating pulses of the halide or metalorganic and the noble metal reactant may be provided. These alternating pulses may be repeated any number of time prior to beginning the regular ALD cycles of noble metal precursor and oxygen containing precursor as described below.

Each ALD cycle comprises alternating and sequential provision of a first and second reactant. A first reactant is conducted into the chamber in the form of vapor phase pulse and contacted with the surface of the substrate. Conditions are selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

A second gaseous reactant is pulsed into the chamber where it reacts with the first reactant bound to the surface. Excess second reactant and gaseous by-products of the surface reaction are removed from the reaction chamber, preferably purged with the aid of an inert gas. The steps of pulsing and purging are repeated until a thin film of the desired thickness has been selectively formed on the substrate, with each cycle leaving no more than a molecular monolayer.

As mentioned above, each pulse or phase of each cycle is preferably self-limiting. An excess of reactant precursors is supplied in each phase to saturate the susceptible substrate surfaces. Surface saturation ensures reactant occupation of all available reactive sites (subject, for example, to physical size or "steric hindrance" restraints) and thus excellent step coverage.

According to a preferred embodiment, a thin film comprising a noble metal is deposited on a surface of a substrate by an ALD type process comprising treating the surface with a halide or metalorganic, purging excess halide or metalorganic from the reaction chamber and multiple pulsing cycles, each cycle comprising:

pulsing a vaporized noble metal precursor into the reaction chamber to form a molecular layer of the metal precursor on the first surface of the substrate, purging the reaction chamber to remove excess noble metal precursor and reaction by products, if any, providing a pulse of a second reactant, such as an oxygen, ozone, ammonia or ammonia plasma containing gas onto the substrate; and purging the reaction chamber to remove excess second reactant and any gaseous by-products formed in the reaction between the metal precursor layer on the first surface of the substrate and the second reactant.

The pulsing and purging cycle is repeated until a thin film of the desired thickness has been formed.

If any halide or organic termination remains on the surface after the first noble metal precursor pulse, it may be removed from the surface prior to continuing the ALD process. For example, an intermediate pulse of water, ammonia, ozone or other chemical suitable for removing halides or organic termination from the surface may be provided.

In one embodiment the ALD process comprises two separate cycles. In the first cycle, the vapor phase halide or metalorganic compound is provided to the reaction chamber, excess halide or metalorganic compound is removed from the reaction chamber, vapor phase noble metal precursor is provided to the reaction chamber and excess precursor is removed. This cycle may be repeated one or more times prior to the second cycle, which comprises alternating pulses of noble metal precursor and oxygen precursor as described above. The first and second cycles may be conducted at the same temperature or at different temperatures.

In some embodiments a halide or metalorganic removal step is provided between the first cycle and the second cycle. However, in another embodiment, the first cycle includes a separate halide or metalorganic removal pulse after provision of the noble metal precursor. For example, the halide or metalorganic removal step may comprise contacting the substrate with water or ammonia. Excess water or ammonia is then removed and the first cycle is repeated or the second ALD cycle is begun.

The thin film typically comprises multiple monolayers of a single noble metal. However, in other embodiments, the final metal structure may comprise two or more different noble metals. For example, the growth can be started with the deposition of platinum and ended with the deposition of ruthenium metal, producing a graded alloy. In other embodiments the thin film is a compound thin film comprising one or more noble metals. In still other embodiments the thin film is a nanolaminate, with at least one layer of the nanolaminate comprising a noble metal.

The substrate can comprise various types of materials. When manufacturing integrated circuits, the substrate typically comprises a number of thin films with varying chemical and physical properties. Preferably, at least one surface comprises a metal oxide or metal nitride. For example, a surface may comprise a silicon oxide or a silicon nitride, such as silicon oxynitride. The substrate may comprise a high-k dielectric layer, a metal layer, or a metal nitride. Exemplary high-k materials include, without limitation, $HfO_2$, $ZrO_2$, $Al_2O_3$, $TiO_2$, $Ta2O_5$, lanthanide oxides and mixtures thereof, silicates and materials such as YSZ (yttria-stabilized zirconia), BST, BT, ST, and SBT. Metals and metal nitrides may be, for example and without limitation, selected from the group consisting of Ta, TaN, $TaC_x$, $TaB_x$, Ti, TiN, $TiC_x$, $TiB_x$, Nb, NbN, $NbC_x$, $NbB_x$, Mo, MoN, $MoC_x$, $MoB_x$, W, WN, $WC_x$, $WN_xC_y$, $WB_x$, V, Cr, Fe, Cu, Co, Ni, Cd, Zn, Al, Ag, Au, Ru, $RuO_x$, Rh, Pt, Pd, $PdO_x$, Ir, $IrO_x$ and Os. Further, the substrate surface may have been patterned and may comprise structures such as nodes, vias and trenches.

Noble metals are well known in the art and include, for example, Ru, Rh, Pd, Ag, Re, Os, Ir, and Pt. Suitable noble metal precursors may be selected by the skilled artisan. The preferred precursors will have an increased reactivity with metal halide or metalorganic compounds compared to metal nitrides or metal oxides. In general, metal compounds where the metal is bound or coordinated to oxygen, nitrogen or carbon are preferred. More preferably metallocene compounds, beta-diketonate compounds and acetamidinato compounds are used.

Particularly preferred noble metal precursors are cyclopentadienyl and acetylacetonate (acac) precursor compounds. In some embodiments a bis(ethylcyclopentadienyl) noble metal compound is used.

When depositing ruthenium thin films, preferred metal precursors may be selected from the group consisting of bis(cyclopentadienyl)ruthenium, tris(2,2,6,6-tetramethyl-3,5-heptanedionato)ruthenium and tris(N,N'-diisopropylacetamidinato)ruthenium(III) and their derivatives, such as bis(N,N'-diisopropylacetamidinato)ruthenium(II) dicarbonyl, bis(ethylcyclopentadienyl)ruthenium, bis(pentamethylcyclopentadienyl)ruthenium and bis(2,2,6,6-tetramethyl-3,5-heptanedionato)(1,5-cyclooctadiene)ruthenium(II). In preferred embodiments, the precursor is bis(ethylcyclopentadienyl)ruthenium ($Ru[EtCp]_2$).

When depositing platinum films, preferred metal precursors include (trimethyl)methylcyclopentadienylplatinum, platinum (II) acetylacetonato, bis(2,2,6,6-tetramethyl-3,5-heptanedionato)platinum(II) and their derivatives.

When depositing iridium films, preferred metal precursor include tris(acetylacetonato)iridium(III) and derivates of those.

When depositing palladium films, preferred metal precursors include bis(hexafluoroacetylacetonate)palladium(II).

As mentioned above, the noble metal ALD process typically comprises alternating pulses of a noble metal precursor and an oxygen-containing reactant. The oxygen-containing reactant pulse may be provided, for example, by pulsing diatomic oxygen gas or a mixture of oxygen and another gas into the reaction chamber. In other embodiments, oxygen is formed inside the reactor, such as by decomposing oxygen containing chemicals. Oxygen containing chemicals that can be decomposed in the reactor to produce oxygen include, without limitation, $H_2O_2$, $N_2O$ and organic peroxides. Mixtures of such chemicals can also be used. In other embodiment, the catalytical formation of an oxygen containing pulse can be provided by introducing into the reactor a pulse of vaporized aqueous solution of $H_2O_2$ and conducting the pulse over a catalytic surface inside the reactor and thereafter into the reaction chamber. The catalytic surface is preferably a piece of platinum or palladium.

In preferred embodiments the oxygen-containing reagent comprises free-oxygen or ozone, more preferably molecular oxygen. The oxygen-containing reagent is preferably pure molecular diatomic oxygen, but can also be a mixture of oxygen and inactive gas, for example, nitrogen or argon. A preferred oxygen-containing reagent is air.

In some embodiments, such as in the deposition of a noble metal on a high-k layer, radicals are not used in the ALD process. Rather than a plasma enhanced ALD process, a thermal ALD process is used.

The noble metal precursor employed in the ALD type processes may be solid, liquid or gaseous material, provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, for single wafer processing the pulsing time is from about 0.05 to 10 seconds. However, depending on the substrate type and its surface area, the pulsing time may be even higher than 10 seconds. For example, for batch reactors pulse times may range from milliseconds to minutes or longer. Preferably, for a 300 mm wafer in a single wafer ALD reactor, the noble metal precursor is pulsed for from 0.05 to 10 seconds, more preferably for from 0.5 to 3 seconds and most preferably for about 0.5 to 1.0 seconds. The oxygen-containing precursor is preferably pulsed for from about 0.05 to 10 seconds, more preferably for from 1 to 5 seconds, most preferably about for from 2 to 3 seconds, but it can be in order of minutes in some cases.

The mass flow rate of the noble metal precursor can be determined by the skilled artisan. In one embodiment, for deposition on 300 mm wafers the flow rate of noble metal precursor is preferably between about 1 and 1000 sccm without limitations, more preferably between about 100 and 500 sccm. The mass flow rate of the noble metal precursor is usually lower than the mass flow rate of oxygen, being usually between 10 and 10000 sccm without limitations, more preferably between about 100-2000 sccm and most preferably between 100-1000 sccm.

Gaseous precursors and/or gaseous byproducts formed in the reaction between the precursors are removed from the reaction chamber, such as by evacuating the chamber with a vacuum pump and/or by purging the gas from inside the reactor with the aid of an inert gas such as argon or nitrogen. Typical purging times are from about 0.05 to 20 seconds, more preferably between about 1 and 10, and still more preferably between about 1 and 2 seconds.

The pressure in the reaction space is typically between about 0.01 and 20 mbar, more preferably between about 1 and 10 mbar.

Examples of suitable reactors that may be used for the deposition of thin films according to the processes of the present invention include commercially available ALD equipment, such as the F-120® reactor, Pulsar® reactor and EmerALD™ reactor, available from ASM America, Inc of Phoenix, Ariz. In addition to these ALD reactors, many other kinds of reactors capable of ALD growth of thin films, including CVD reactors equipped with appropriate equipment and means for pulsing the precursors, can be employed for carrying out the processes of the present invention. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which clearly improves the throughput compared to a reactor in which is the substrate is heated up to the process temperature before each run. In addition, pump time is saved if the transfer area behind a load lock is maintained at a low base pressure.

Before starting the deposition of the film, the substrate is typically heated to a suitable growth temperature. Preferably, the growth temperature of the metal thin film is between about 150° C. and about 450° C., more preferably between about 200° C. and about 400° C. The preferred deposition temperature may vary depending on a number of factors such as, and without limitation, the reactant precursors, the pressure, flow rate, the arrangement of the reactor, and the composition of the substrate including the nature of the material to be deposited on and the nature of the material on which deposition is to be avoided. The specific growth temperature may be selected by the skilled artisan using routine experimentation to maximize the selectivity of the process.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be in order of minutes or more in some cases. For example, longer processing times may be employed in batch processing.

Typically, the ALD process includes an incubation period before which a consistent growth rate is established. The incubation time may vary depending on a variety of factors, including temperature, pressure, precursors and the nature of the surface on which deposition is to take place. For example, as discussed in Example 1, below, incubation time is less pronounced on $Al_2O_3$ than on $SiO_2$.

Incubation time is also dependent on temperature. For example, at higher temperatures, such as 360° C., ALD growth of noble metals can be started fairly easily on $Al_2O_3$ but not on $SiO_2$. That is, at higher temperatures the incubation time on $Al_2O_3$ is fairly short, as discussed in Example 1 below. However, at higher temperatures such as 360° C., the noble metal surface is roughened. As discussed herein, halide or organic surface termination produced by treatment with a halide or metalorganic compound can reduce or eliminate incubation time. Thus, after halide or metalorganic treatment a lower temperature can be used to deposit a thin film comprising a noble metal on $Al_2O_3$ without a long incubation time and surface roughness is avoided. Similarly, surface treatment allows for the ALD of thin films comprising noble metals on $SiO_2$.

Deposition of Noble Metal Containing Metal Alloys Nitrides and Carbides

In addition to being used to enhance deposition of elemental noble metal films, surface termination with particular ligands can be used in ALD methods for the deposition of films comprising one or more noble metals, including metal alloy, metal oxide, metal nitride and metal carbide films comprising one or more noble metals. As described above, a pulse of a halide compound or metalorganic compound can be utilized to leave the surface terminated with halides or organic groups. By utilizing these groups in the deposition of noble metal-containing films, a compound thin film comprising one or more noble metals can be deposited. However, in preferred embodiments an additional step of scavenging halide or organic ligands that remain after contacting the substrate with a noble metal precursor is utilized.

A surface terminated with halide or organic groups will react with a noble metal-containing precursor. However, because noble metal precursors are generally bulky, steric hindrance may prevent the noble metal precursor from occupying all possible reactive sites. As a result, there will likely be some halides or organic groups left in the growing thin film. These halide or organic ligands, which would otherwise remain in the film as an impurity, can be removed by providing a scavenging agent. After the impurity scavenging step, the regular deposition cycle is resumed. In some embodiments the scavenging agent contributes one or more species to the growing film, while in other embodiments it does not.

In one embodiment a noble metal alloy film is deposited by ALD. The noble metal alloy preferably has the formula $XM_x$, where X is a noble metal, preferably Ru, and M is preferably a metal, more preferably selected from the group consisting of Sc, Ti, V, Fe, Cr, Mn, Zn, B, C, Al, Si, P, Zr, Nb, Mo, In, Ga, Ge, Sn, Hf, Ta and W. In the first step of the first ALD deposition cycle the substrate is reacted with a halide compound or metalorganic compound comprising M. This results in a halide or organic terminated surface. In one particular embodiment M is tantalum and the halide reactant is preferably a tantalum halide compound. In a second step of the first deposition cycle, the noble metal-containing precursor, preferably a ruthenium precursor, is provided and reacts with the halide or organic terminated surface, resulting in a molecular layer containing M, unreacted halide or organic impurities and noble metal on the substrate. In the third step of the first deposition cycle the halide or organic impurities are removed by providing a scavenging agent, such as hydrogen, hydrogen plasma or hydrogen radicals. After the third step, a second deposition cycle begins by providing the M containing halide or metalorganic reactant. The deposition cycle continues with analogous second and third steps. The process is continued until the desired thickness of the film is achieved.

In another embodiment a noble metal nitride film is deposited by ALD. The noble metal nitride film preferably has the formula $XM_yN$, where X is a noble metal, preferably Ru, M is preferably a metal, more preferably selected from the group consisting of Sc, Ti, V, Fe, Cr, Mn, Zn, B, C, Al, Si, P, Zr, Nb, Mo, In, Ga, Ge, Sn, Hf, Ta and W and N is nitrogen. In the first step of the first deposition cycle the substrate is reacted with a halide or metalorganic compound comprising M, preferably with a titanium halide. As a result, a halide or organic terminated surface is formed on the substrate. In the second step of the first cycle the noble metal containing precursor, preferably a ruthenium precursor, is reacted with the halide or organic terminated surface and a molecular layer containing M, unreacted halide or organic impurities and noble metal is formed. In the third step of the first deposition cycle the halide or organic impurities are removed by contacting the substrate with a scavenging agent, such as ammonia or nitrogen and hydrogen plasma or nitrogen and hydrogen radicals. The scavenging agent also preferably leaves nitrogen in the growing film. However, in some embodiments the scavenging agent does not contribute to the film and an additional step is included in the deposition cycle in which a nitrogen containing compound is provided that contributes nitrogen to the growing film. After the third step, a second deposition cycle is started by again providing the M containing halide or metalorganic compound and the process is continued with analogous second and third steps. The process is continued until the desired thickness of the film is achieved.

Similar processes can be utilized to deposit metal carbides and metal oxides comprising one or more noble metals. In some such embodiments a scavenging agent is used that contributes carbon or oxygen to the growing film, while in other embodiments the scavenging agent does not contribute to the film and a separate step is included in the deposition process for providing carbon or oxygen to the growing film.

In some embodiments, the scavenging agent is provided in every deposition cycle. However, in other embodiments the scavenging agent is provided at intervals during the deposition process. For example the scavenging agent may be introduced in every $5^{th}$, $10^{th}$, $20^{th}$ or $50^{th}$ deposition cycle. In still other embodiments, the scavenging agent is provided only in the first one to five deposition cycles. Similarly, in some embodiments the noble metal precursor is not introduced in every deposition cycle, but at a desired frequency to form a film with a particular composition and thickness. The particular frequency of provision of each reactant will depend on the particular reaction conditions and the desired composition of the film being deposited. Selection of the appropriate frequency can be determined by the skilled artisan without undue experimentation.

Surface Treatment for Selective Deposition

Halide or metalorganics react with different materials at different temperatures. In particular, halides do not appreciably react with $SiO_2$ at low temperatures. This differential reactivity can be taken advantage of to selectively deposit noble metals by ALD. For example, it can be used to avoid deposition on the quartz walls of a reaction chamber. In other embodiments it can be used to selectively deposit a noble metal on a high-k material on a substrate, while avoiding deposition on conventional silicon oxide or silicon nitride containing insulator surfaces on the substrate. In each of these embodiments, halide or metalorganic treatment conditions are utilized such that the surface to be deposited on is treated while the surface on which deposition is not wanted does not react with the halide or metalorganic and thus remains untreated.

"High-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, lanthanide oxides and mixtures thereof, silicates and materials such as YSZ (yttria-stabilized zirconia), BST, BT, ST, and SBT.

In one embodiment a noble metal is selectively deposited on a first substrate surface, such as a high-k layer, relative to a second surface, such as an adjacent insulator. A halide or metalorganic is introduced into a reaction space at temperature that allows it to react with the first substrate surface. The treatment temperature is preferably selected to be below the temperature at which the halide or metalorganic reacts with the second surface. For example, at temperatures below about 300° C., HCl reacts with high-k materials but does not react with $SiO_2$ surfaces. Thus, a halide or metalorganic termination can be produced on a first high-k surface on a substrate but not on a second adjacent silicon oxide surface by treating the substrate with a vapor phase halide or metalorganic, such as HCl, at a temperature less than about 300° C. In this way, subsequent noble metal deposition is enhanced on the first surface (on which deposition is desired) and not on the second surface (on which deposition is to be avoided).

In some embodiments deposition is avoided on the quartz walls of the reactor by employing a halide or metalorganic treatment. A halide or metalorganic reactant is first introduced into the reaction chamber. The temperature is selected such that the halide or metalorganic reacts with the substrate surface on which deposition is desired, but not with the reaction chamber walls, which comprise silicon oxide. Preferably the treatment temperature is less than about 300° C.

The halide or metalorganic reactant is removed and a noble metal thin film is deposited on the substrate by ALD. In one embodiment the noble metal thin film is deposited at the same temperature as the halide or metalorganic treatment. Because surface termination on the walls of the reactor was not affected by the halide or metalorganic treatment, deposition on the walls is avoided.

In one embodiment ruthenium is to be deposited on an $Al_2O_3$ surface of substrates in a batch ALD reactor. The $Al_2O_3$ surface is modified with a halide, such as HCl, at low temperature prior to beginning the ALD ruthenium deposition cycles. Vapor-phase HCl is provided to the reaction chamber and allowed to contact the substrates. Preferably the halide treatment temperature is less than about 300° C.

At the low treatment temperature, the HCl modifies the $Al_2O_3$ surface, resulting in a halide termination, but does not appreciably react with the walls of the reactor. Ruthenium or another noble metal is then deposited by ALD cycles from $Ru(EtCp)_2$ and an oxygen reactant as described above. Preferably the reaction temperature is less than or equal to about 300° C. Because of the halide termination, deposition is facilitated on the $Al_2O_3$ substrate surfaces. However, ruthenium has a very long incubation time on $SiO_2$ at the reaction temperature. As a result, deposition can be minimized or avoided on the walls of the reactor.

In other embodiments, the differential reactivity to halide or metalorganics at a given temperature is used to selectively deposit noble metal on one surface of a substrate relative to a second surface. Thus, in particular embodiments, a noble metal film is selectively deposited on a first surface comprising a high-k material while avoiding deposition on a second surface comprising a lower k insulator. In preferred embodiments the insulator is a conventional silicon oxide or silicon nitride based insulator. In other embodiments the insulator is selected from the group consisting of silicon oxide, silicon nitride, silicon oxynitride, fluorinated silica glass (FSG), carbon doped silicon oxide (SiOC) and materials containing more than 50% of silicon oxide.

The substrate is treated with a halide or metalorganic at a temperature at which the halide or metalorganic reacts with the high-k material but not with the lower k insulating material. Preferably, the substrate is treated with the halide or metalorganic at a temperature of less than about 300° C.

ALD of the noble metal can be carried out at a temperature that allows deposition on the treated high-k surface but disfavors deposition on the untreated $SiO_2$ surface. For example, the growth temperature of the metal thin film may be between about 150° C. and about 450° C., more preferably between about 200° C. and about 300° C. In one embodiment the noble metal thin films are grown at about 260° C.

The preferred noble metal deposition temperature may vary depending on a number of factors such as, and without limitation, the reactant precursors, the pressure, flow rate, the arrangement of the reactor, and the composition of the substrate including the nature of the material to be deposited on and the nature of the material on which deposition is to be avoided. The specific growth temperature may be selected by the skilled artisan using routine experimentation to maximize the selectivity of the process.

Formation of Gate Electrodes Using Selective Deposition

The ability to deposit on a first surface, such as a high-k material, while avoiding deposition on a second surface, such as a silicon oxide surface, can be utilized in the formation of a gate electrode.

Several embodiments are illustrated in FIGS. 1 through 21. Other processes that take advantage of the ability to selectively deposit noble metals will be apparent to the skilled artisan. In each of the embodiments the halide or metalorganic treatment is preferably conducted at a temperature less than about 300° C.

Figure 2:
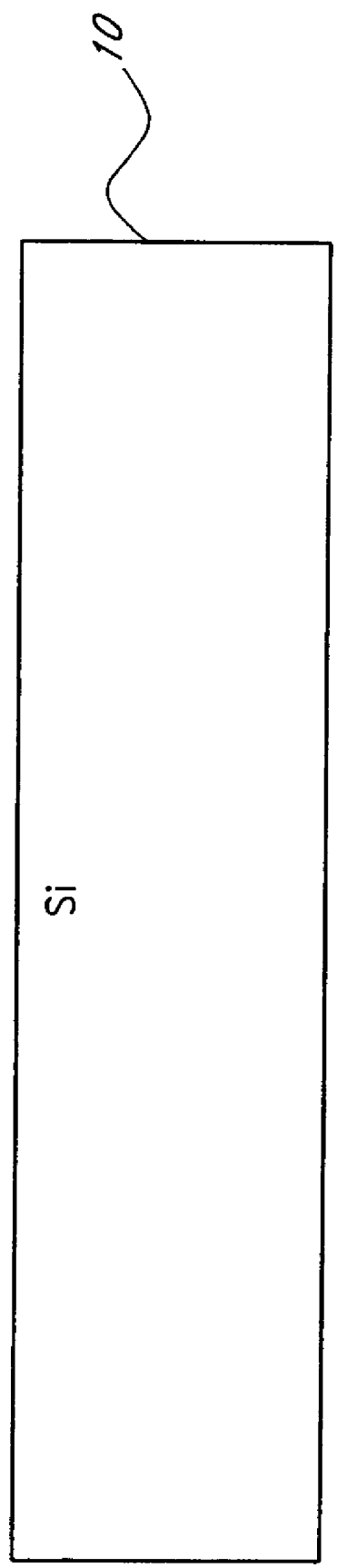
Figure 3:
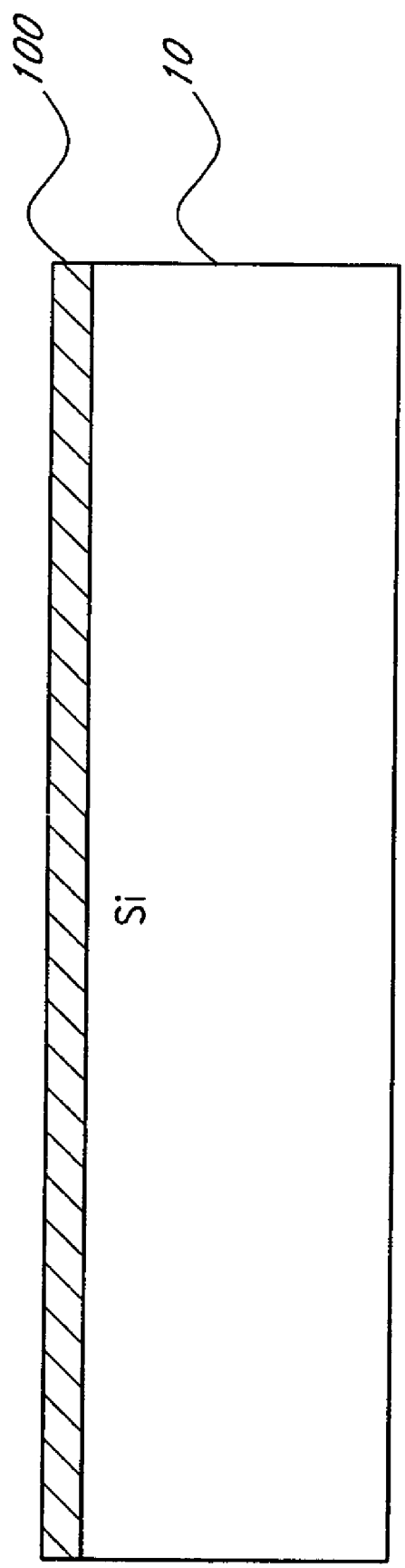

In FIG. 1, a silicon substrate 10 is illustrated comprising a layer of native oxide 50. The native oxide 50 is removed by etching, leaving the bare substrate 10 as shown in FIG. 2. The surface of the substrate is then prepared for deposition of a high-k layer by ALD, such as by the deposition of a thin interfacial layer. For example, a thin chemical oxide or oxynitride may be formed on the surface. In other embodiments a thermal oxide is grown on the substrate. In one embodiment the thin interfacial layer is from about 2 to about 15 angstroms thick. FIG. 3 illustrates a thin layer interfacial layer 100 of Silicon oxide grown over the substrate 10.

Figure 4:
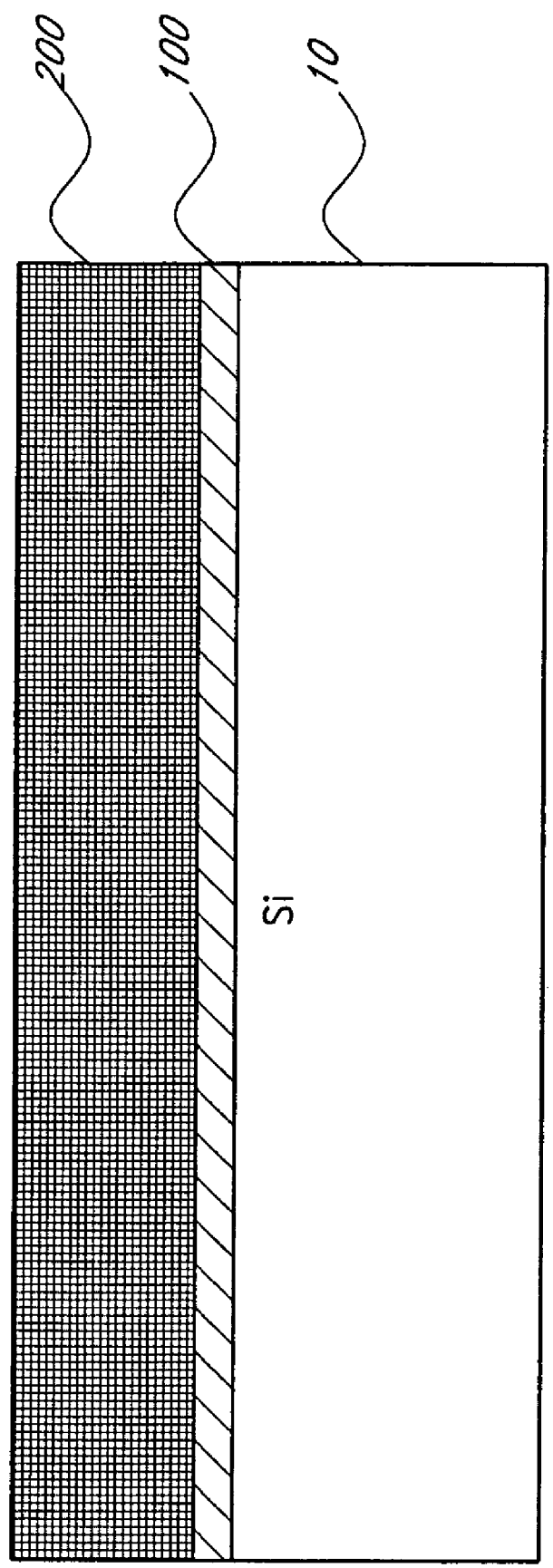
Figure 5:
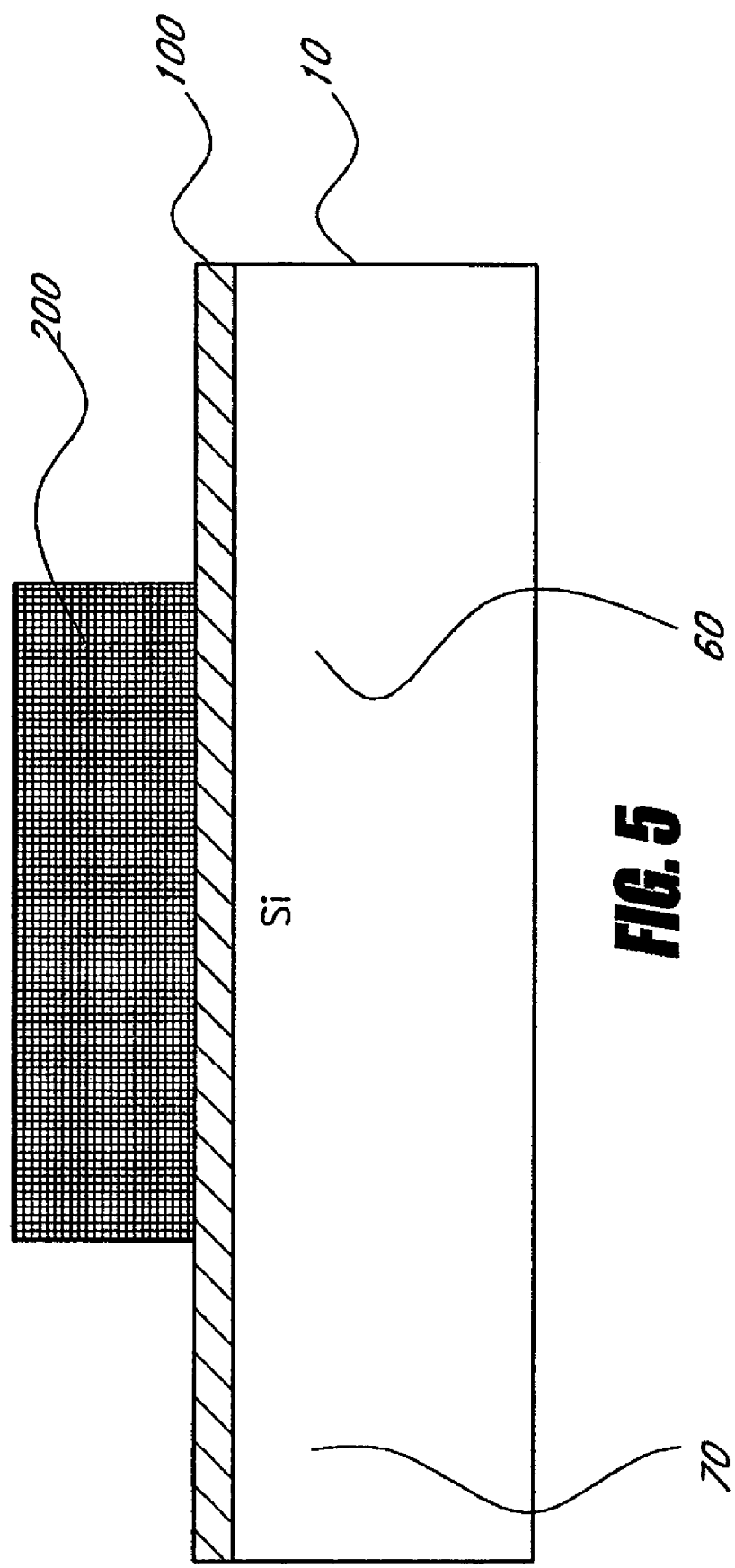
Figure 6:
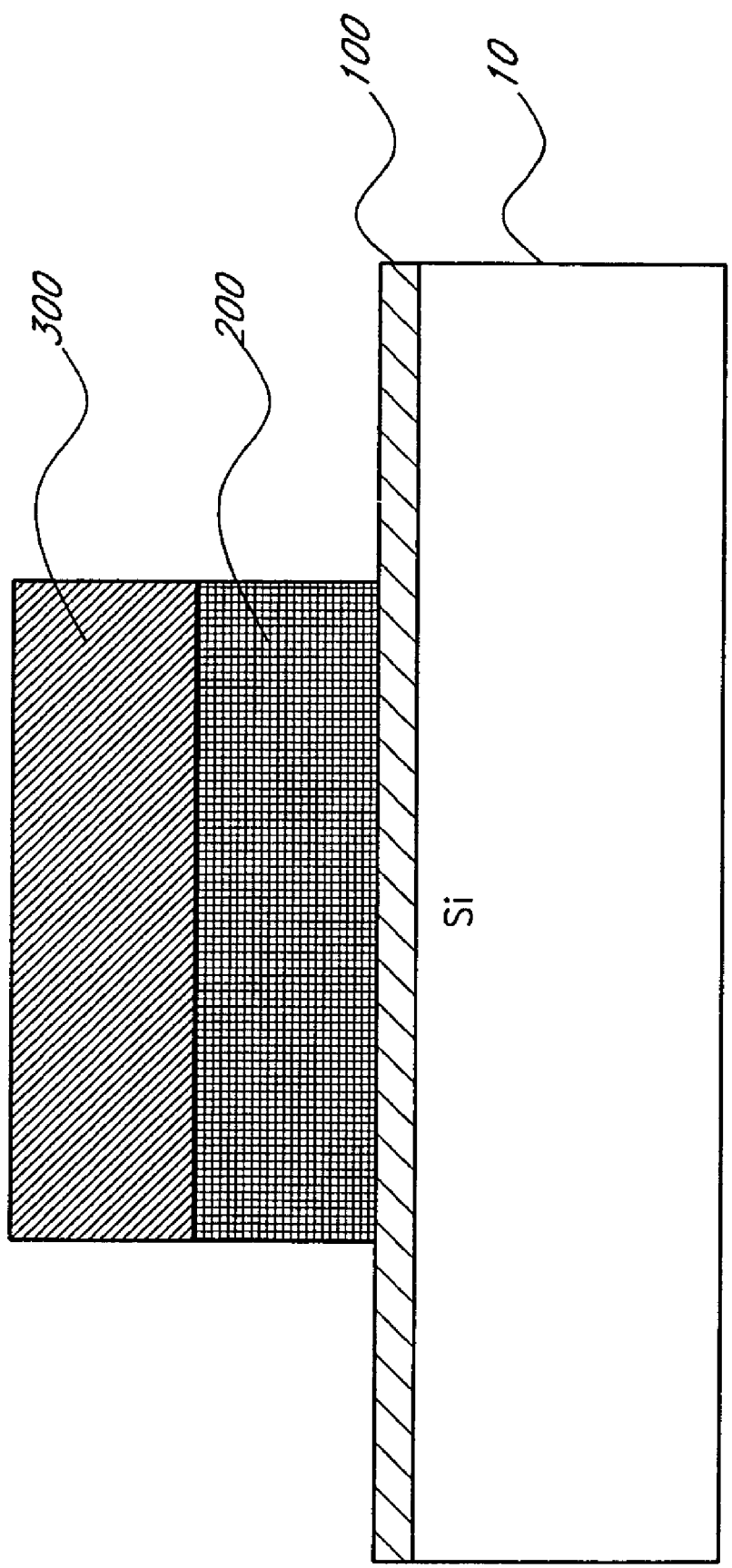

A thin layer of high-k material 200 is subsequently deposited over the interfacial layer 100 to form the structure illustrated in FIG. 4. The high-k material 200 is then patterned such that it remains over the channel region 60 and not over the regions 70 that will become the source and drain, as illustrated in FIG. 5. The substrate is treated with a halide, such as a metal halide or hydrogen halide, or metalorganic compound, such as alkyl or alkylamide compound. Finally, a layer of Ru 300 is selectively deposited over the patterned high-k material 200 by ALD to form the structure illustrated in FIG. 6.

In some embodiments the Ru forms the gate electrode. In other embodiments (not shown) another conductive material, such as a metal or poly-Si, is deposited over the selectively deposited Ru. In some embodiments the additional conductive material is selectively deposited over the ruthenium to form a gate electrode. In other embodiments the additional conductive material is patterned to form a gate electrode. Further processing steps, such as spacer deposition and source/drain implantation will be apparent to the skilled artisan.

Figure 7:
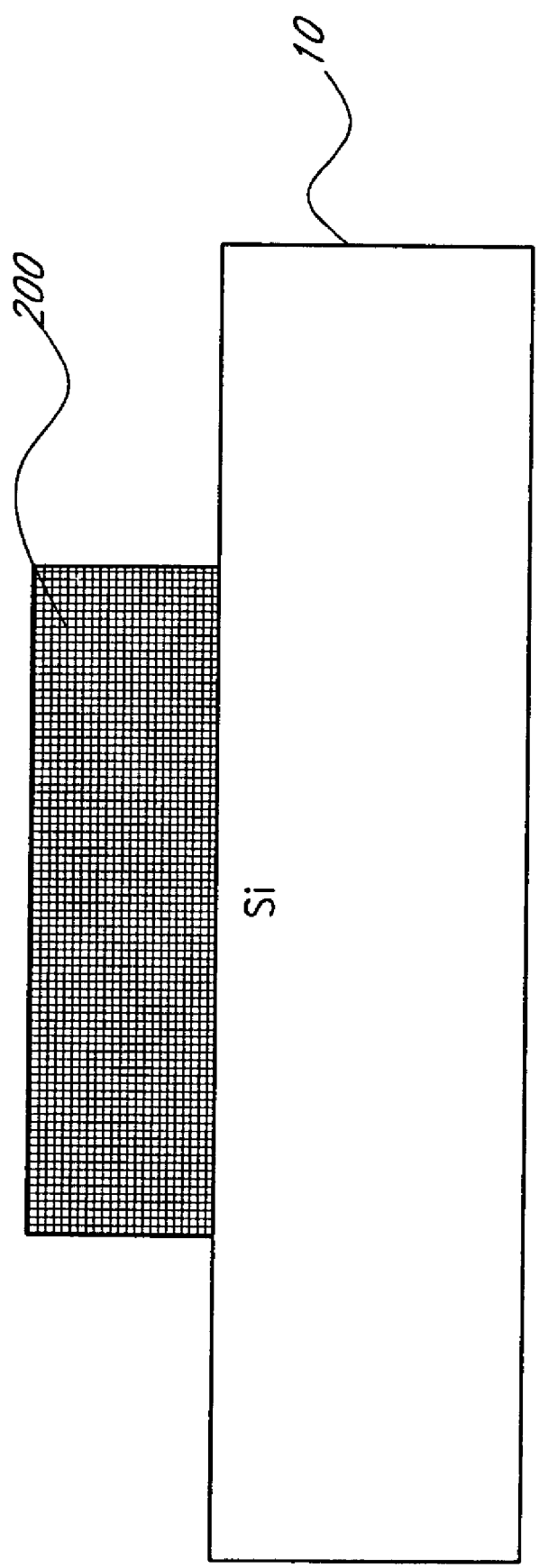
FIGS. 7-9 are schematic cross-sections of partially fabricated integrated circuits, illustrating another process flow for the formation of a gate electrode utilizing a selective noble metal deposition process.
Figure 8:
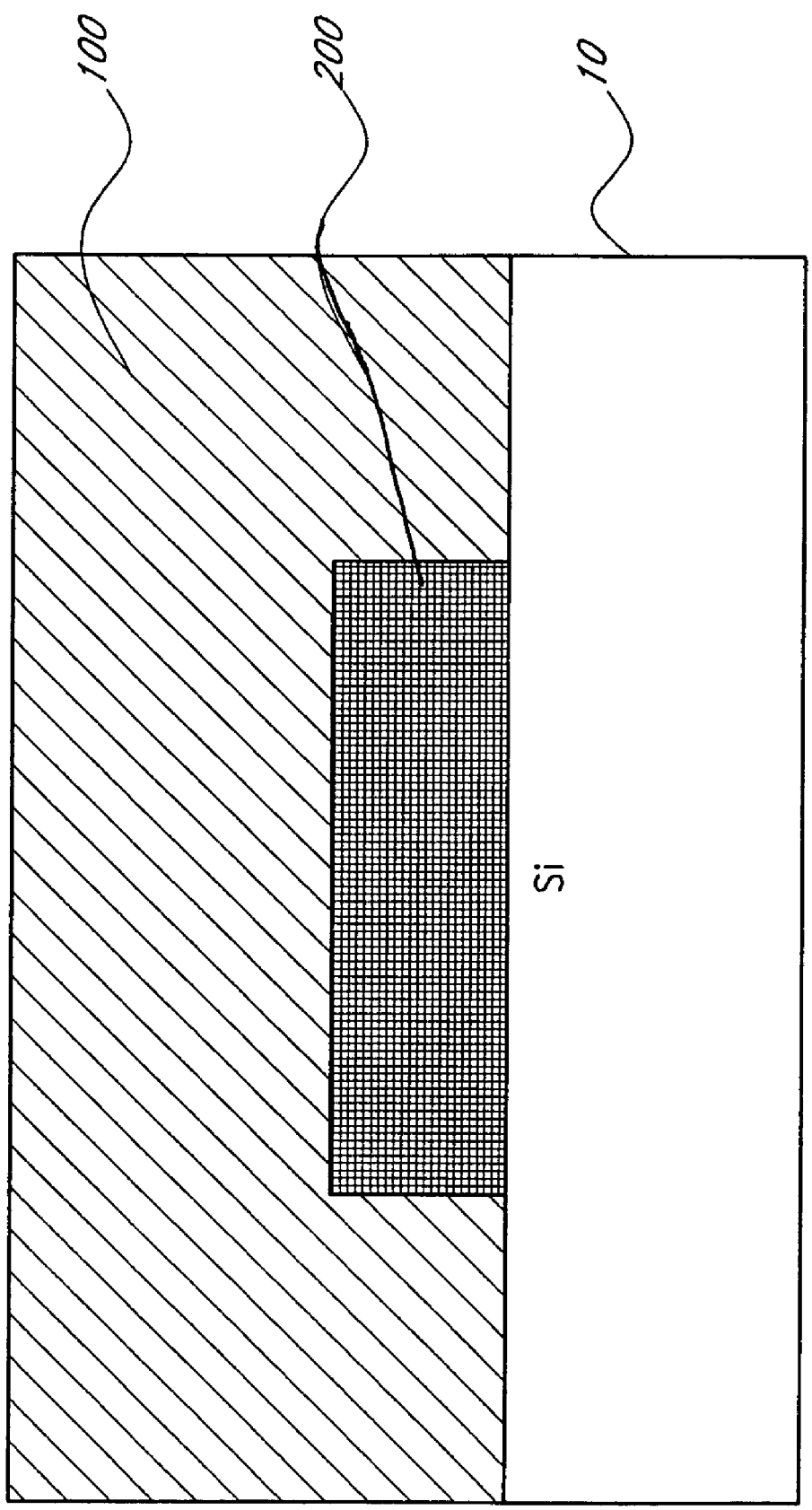
Figure 9:
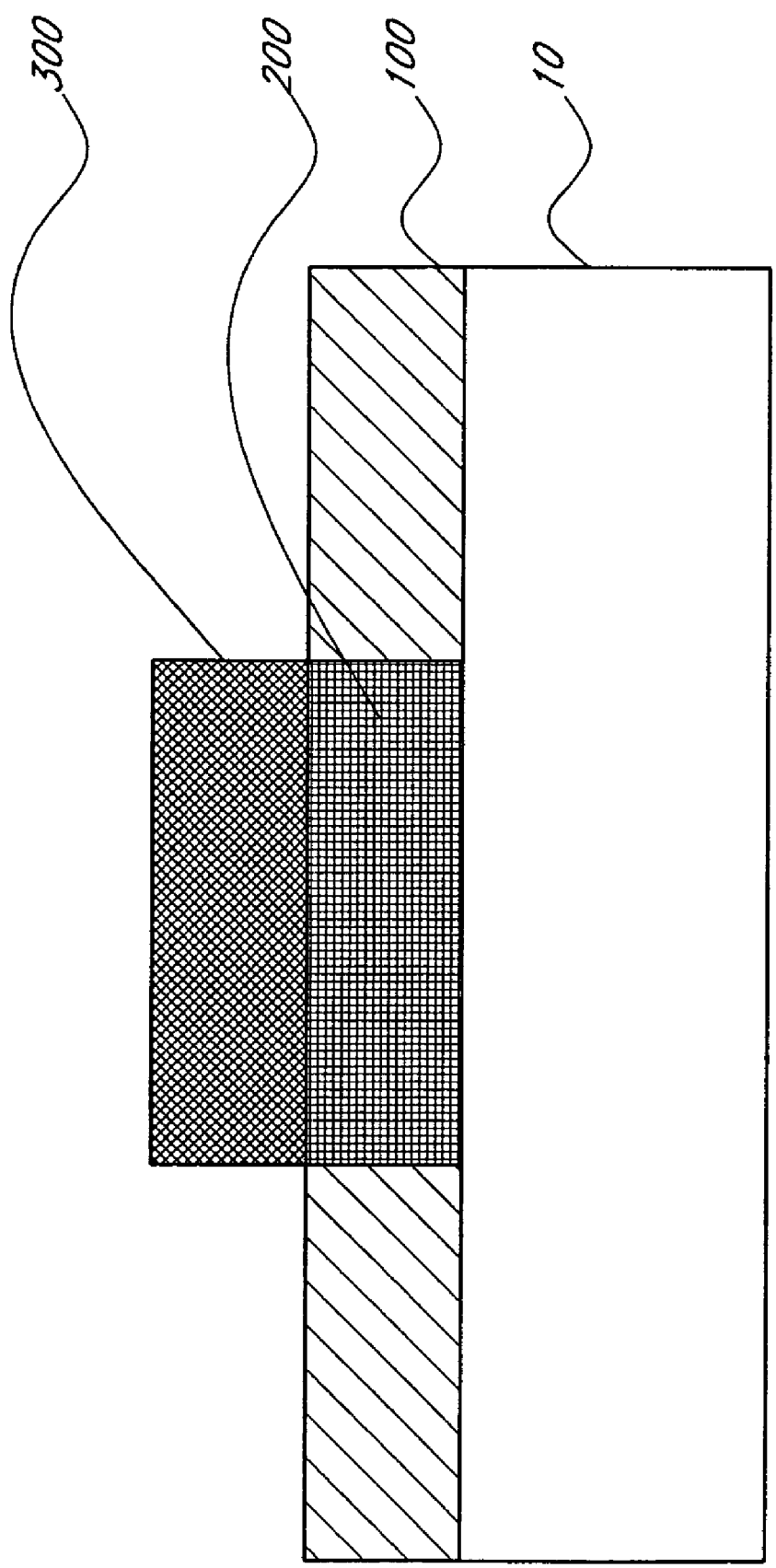

A second embodiment is illustrated in FIGS. 7-9. In FIG. 7, a layer of high-k material 200 is deposited over a silicon substrate 10 and patterned. The substrate may have been treated prior to deposition of the high-k material 200. For example, a layer of native oxide may have been removed and the surface treated to facilitate high-k deposition.

A layer of silicon oxide 100 is formed over the substrate 10 and covers the high-k material 200, as illustrated in FIG. 8. The silicon oxide layer 100 is patterned to expose the underlying high-k layer 200, thereby exposing the high-k layer 200. The substrate is treated with a halide, such as a metal halide or hydrogen halide, or metalorganic compound, such as alkyl or alkylamide compound A layer of ruthenium 300 is selectively deposited over the high-k material 200 to form the gate electrode structure shown in FIG. 9. In some embodiments the Ru layer forms the gate electrode, while in other embodiments a further conductive material may be deposited over the Ru to form the gate electrode.

Figure 10:
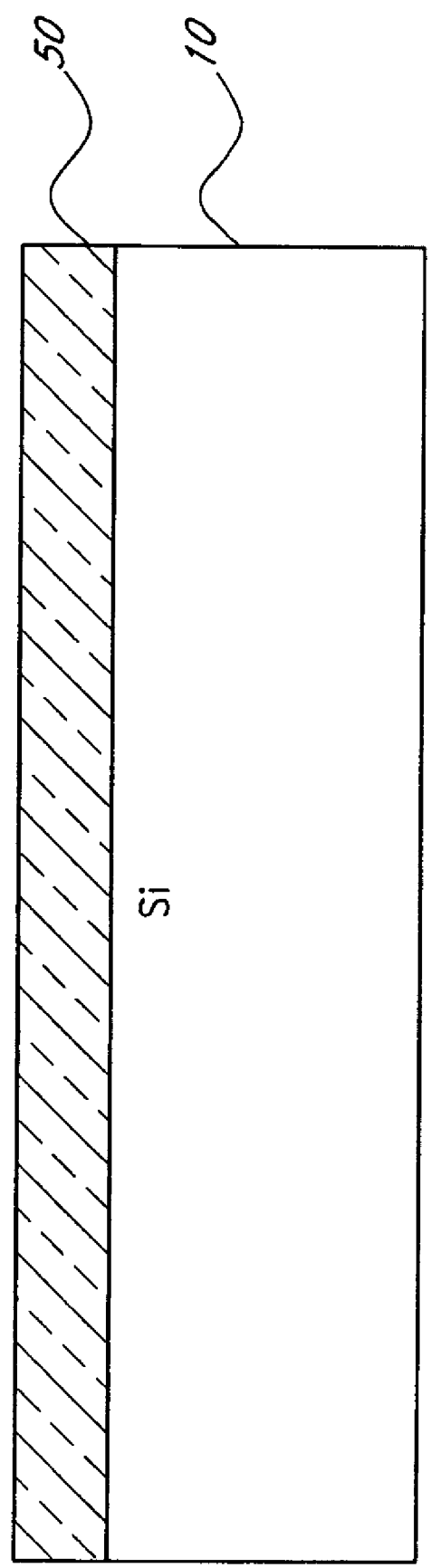
FIGS. 10-16 are schematic cross-sections of partially fabricated integrated circuits, illustrating a gate last process flow for the formation of a gate electrode utilizing selective noble metal deposition.
Figure 11:
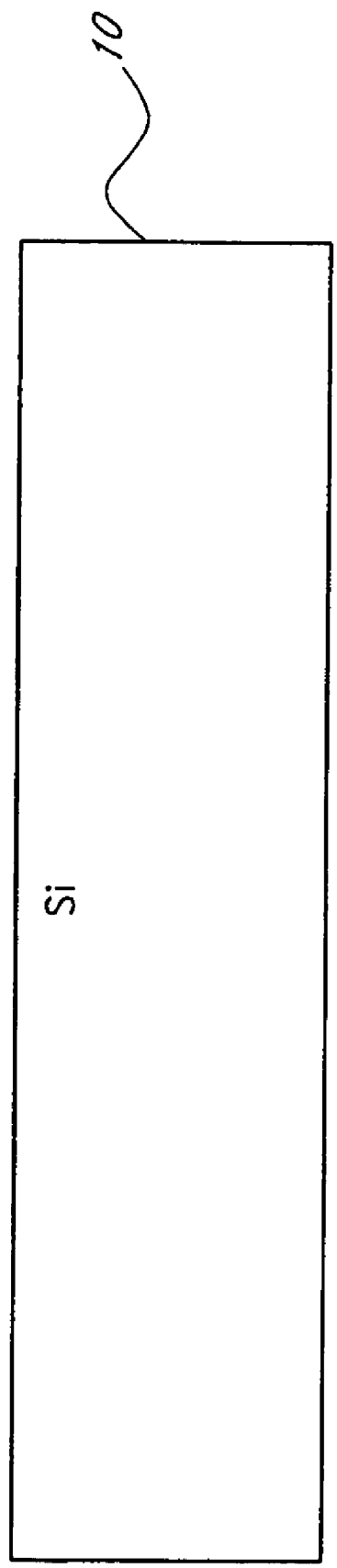
Figure 12:
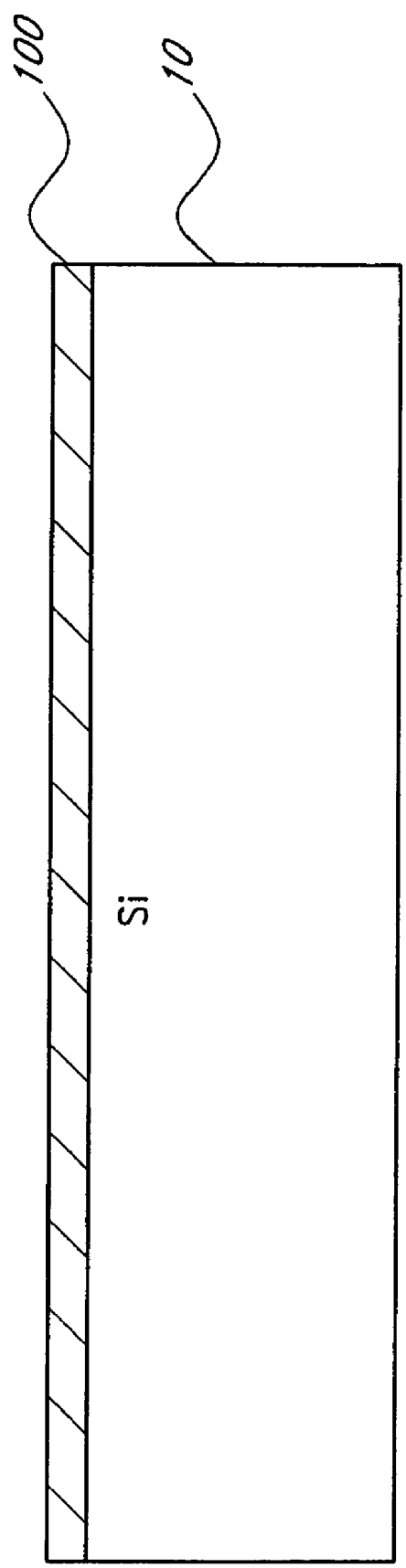
Figure 13:
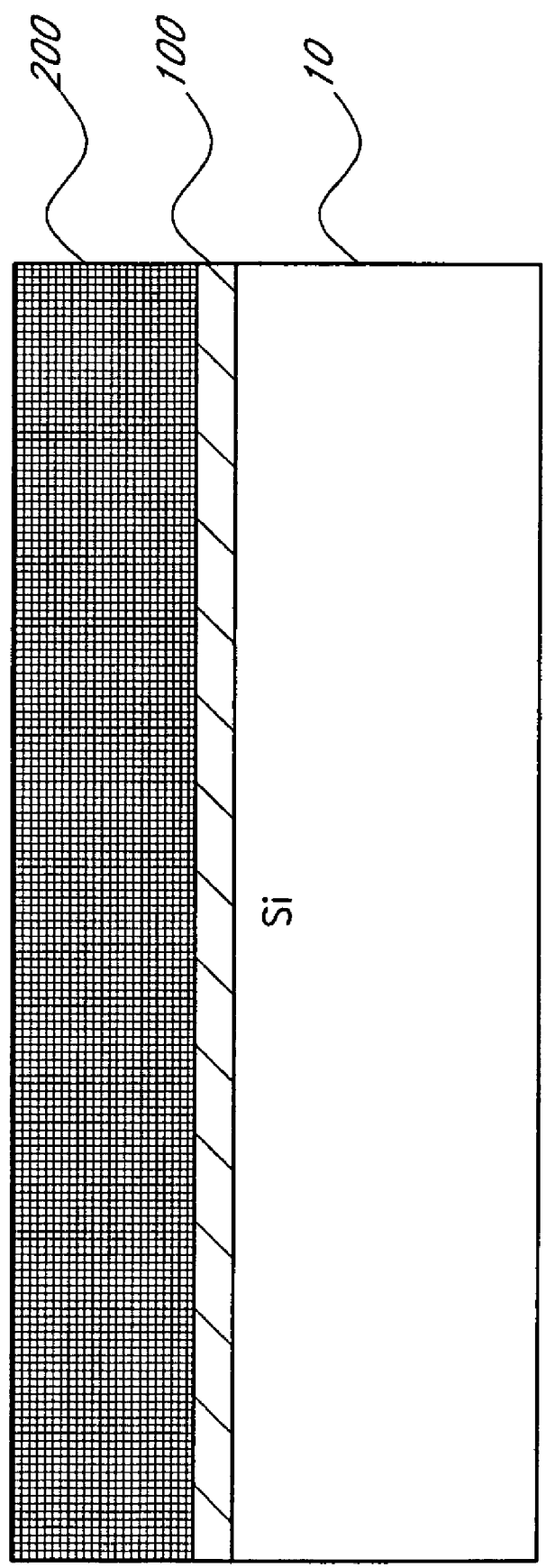
Figure 14:
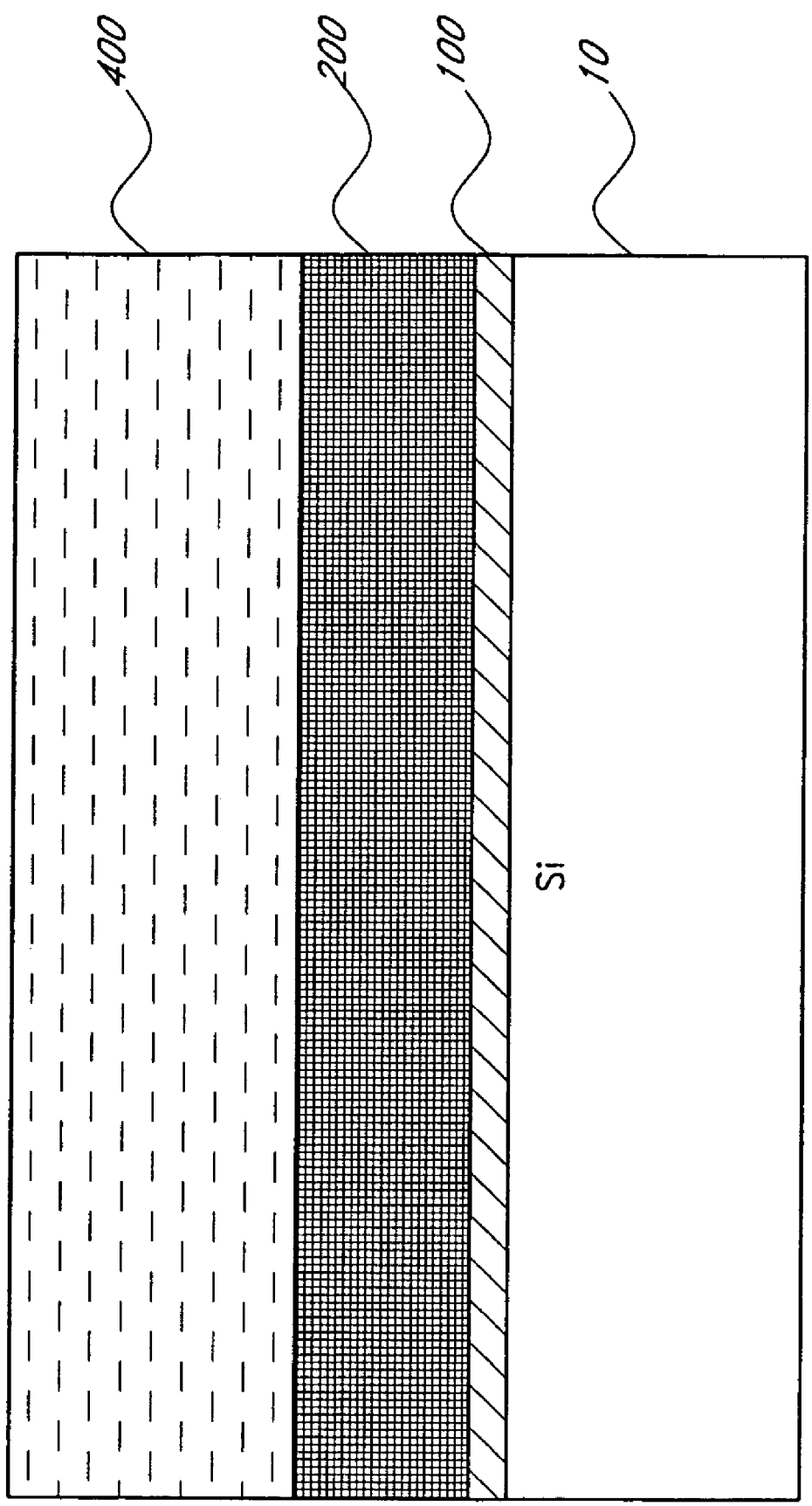
Figure 15:
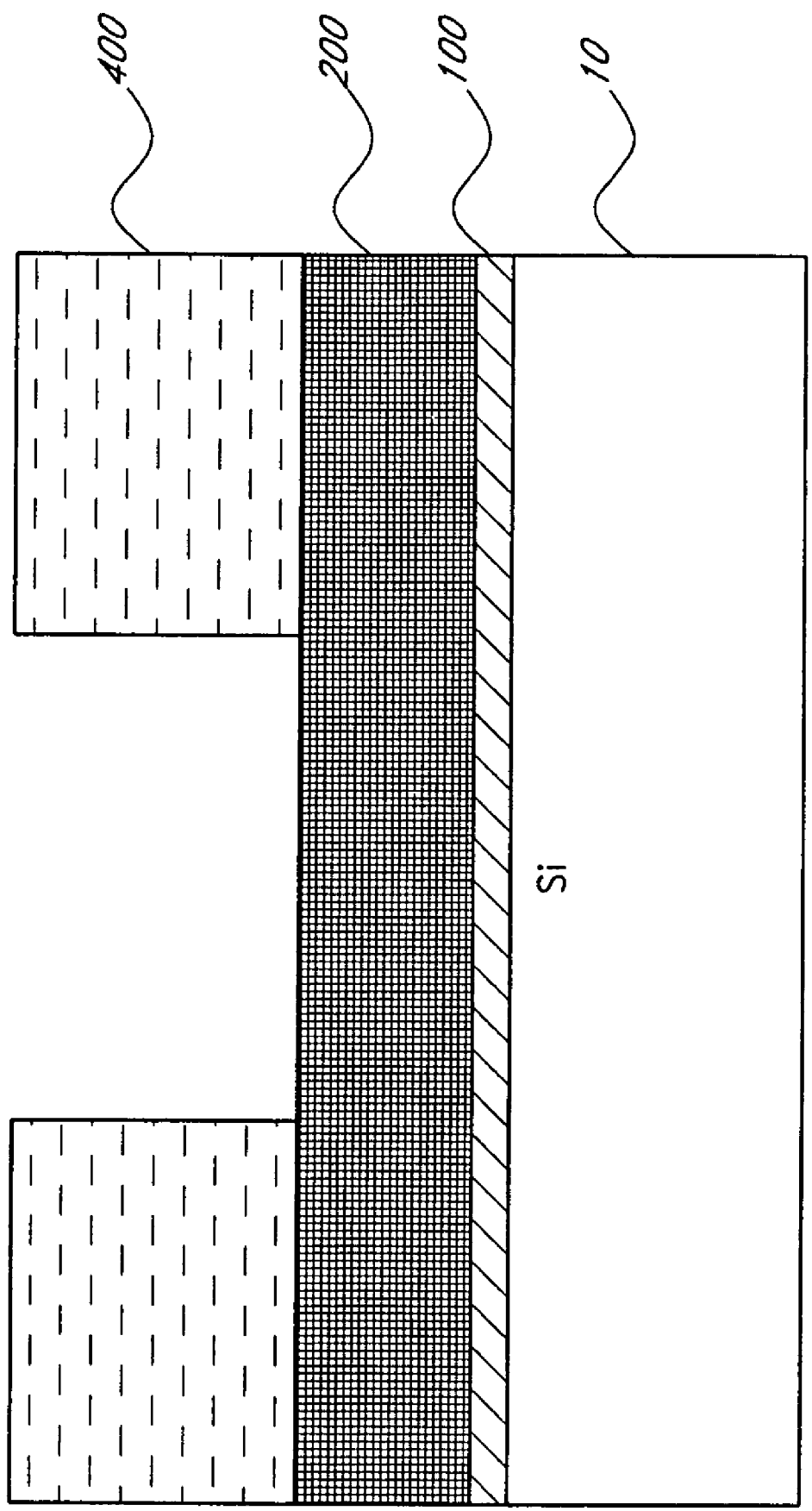

A gate-last approach is illustrated in FIGS. 10-15. FIG. 10 shows a silicon substrate 10 with a layer of native oxide 50. In FIG. 11, the native oxide 50 is removed by etching, leaving the bare silicon substrate 10. A silicon oxide or silicon nitride interface layer 100 with thickness of 2-15 Å is formed over the bare substrate 10 to produce the structure illustrated in FIG. 12. A high-k layer 200 is deposited by ALD over the interface layer 100 to form the structure of FIG. 13. This is followed by deposition of a silicon oxide layer 400 (FIG. 14). The silicon oxide layer 400 is patterned to expose the underlying high-k layer 200 (FIG. 15). The substrate is treated with a halide, such as a metal halide or hydrogen halide, or metalorganic compound, such as alkyl or alkylamide compound. A layer of ruthenium or another noble metal 300 is subsequently deposited selectively over the exposed high-k layer 200 to form a gate electrode as illustrated in FIG. 16A. Further process steps, such as deposition of conductor or contact metals and patterning will be apparent to the skilled artisan.

Figure 16B:
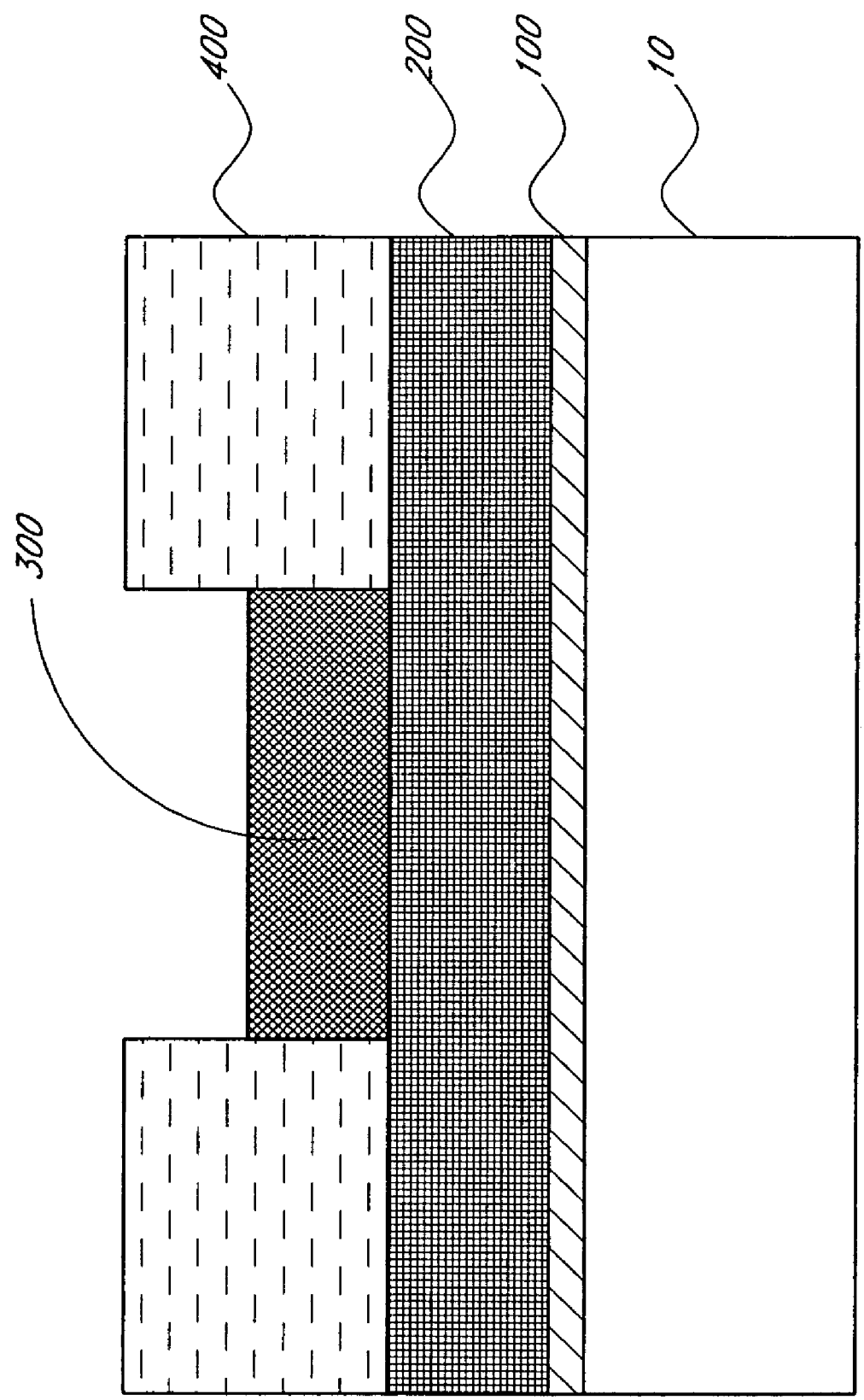
Figure 16C:
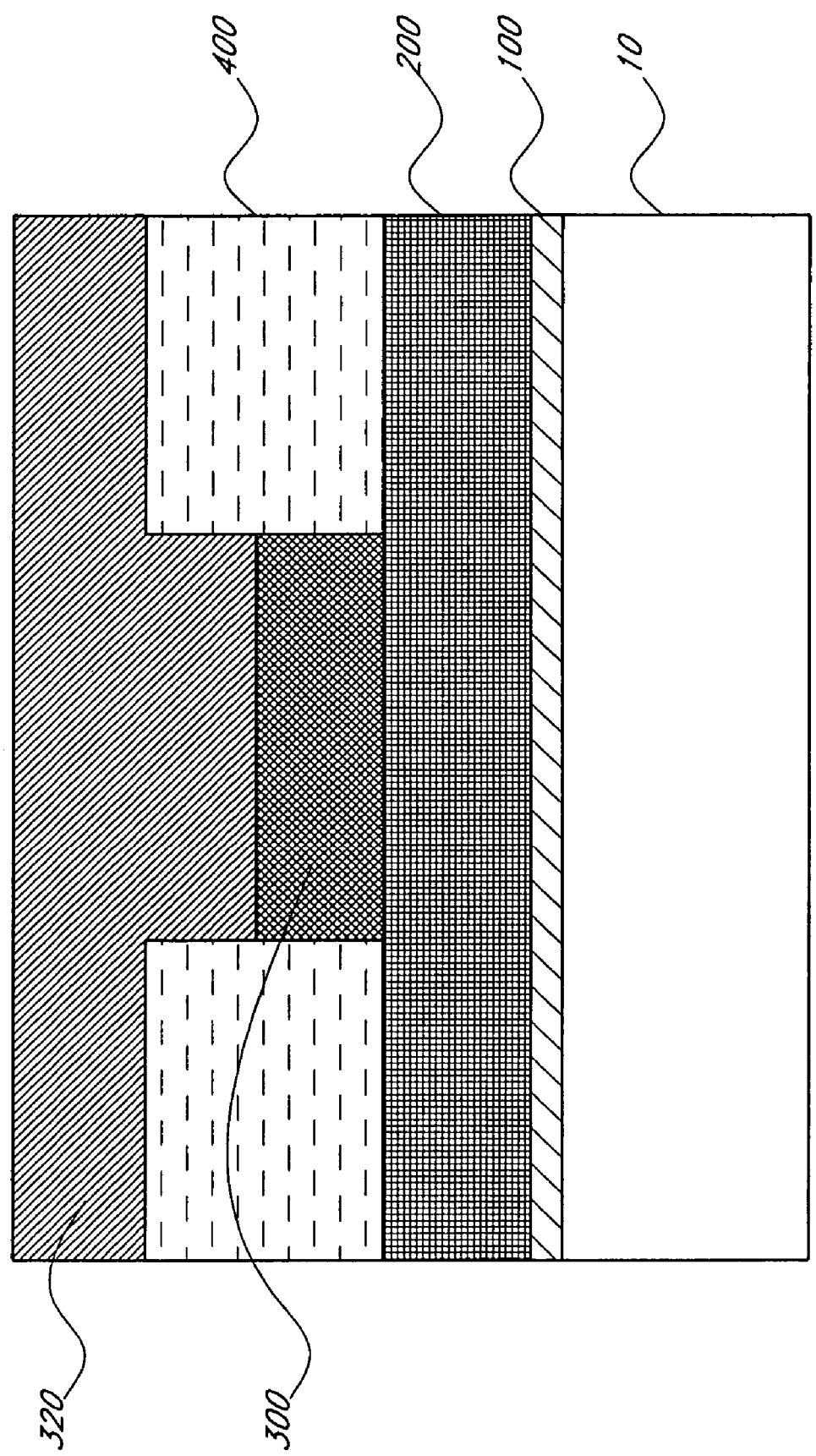

It will be understood by the skilled artisan that the ruthenium layer 300 need not fill the space over the high-k layer 200. That is, in some embodiments the ruthenium layer 300 may not reach the upper surface of the silicon oxide layer 400 as illustrated in FIG. 16B. In a further step, a conductor 320 is deposited over the ruthenium layer 300 (FIG. 16C). The conductor is subsequently polished to form the gate electrode (not shown).

Figure 17:
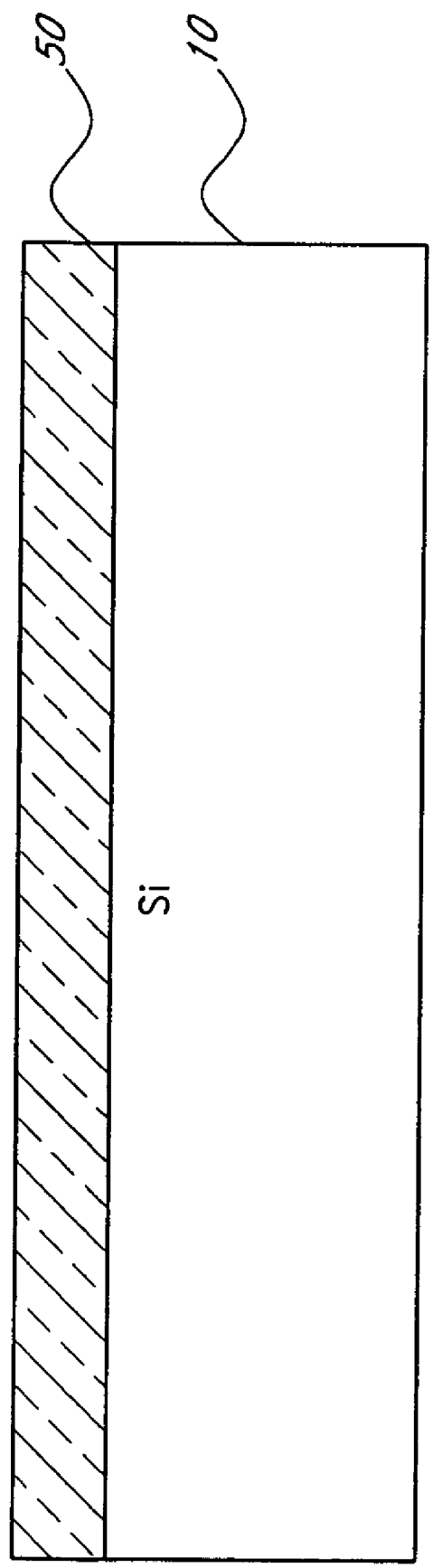
FIGS. 17-23 are schematic cross-sections of partially fabricated integrated circuits, illustrating another gate last process flow for the formation of a gate electrode utilizing selective noble metal deposition.
Figure 18:
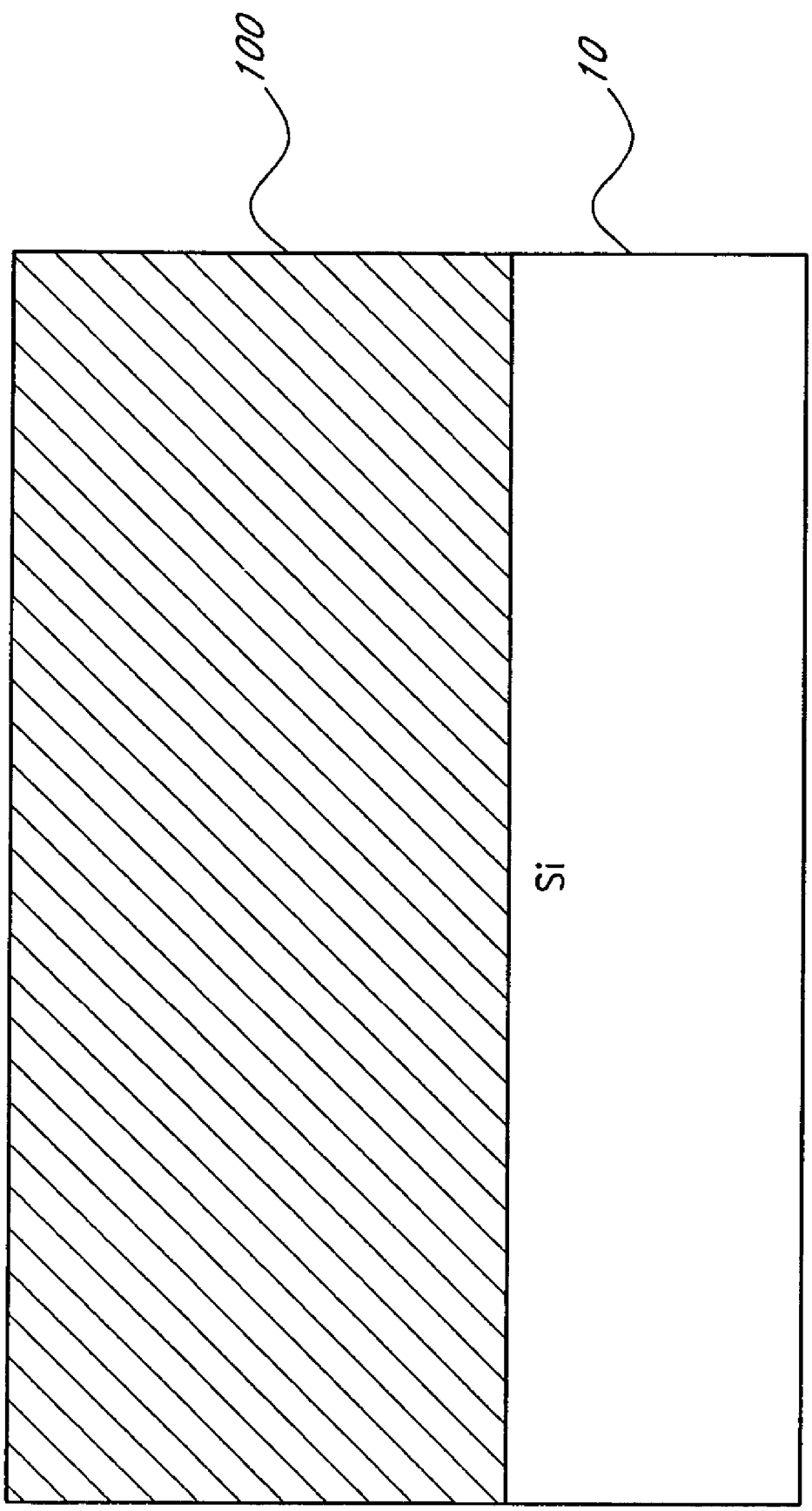
Figure 19:
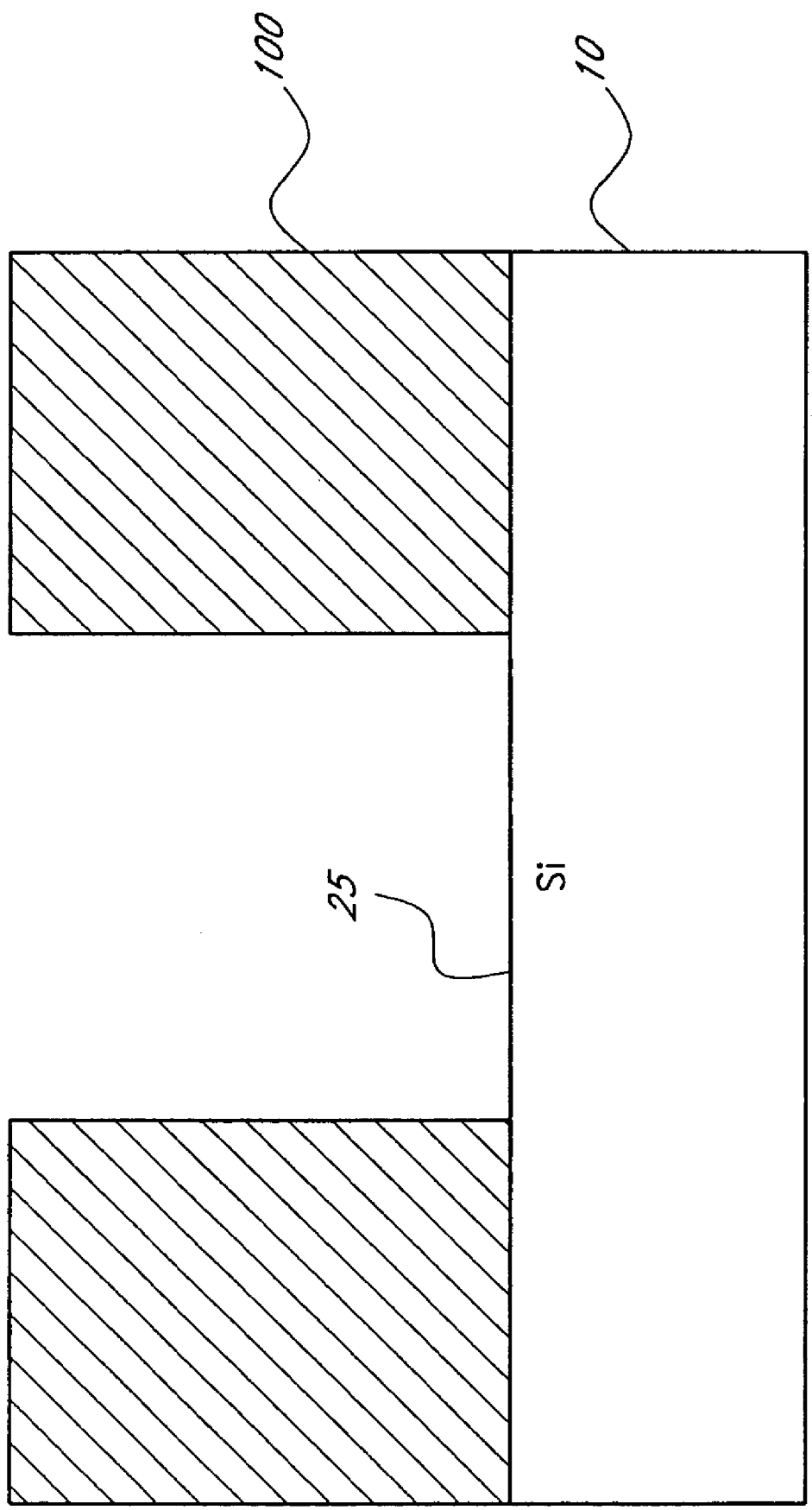
Figure 20:
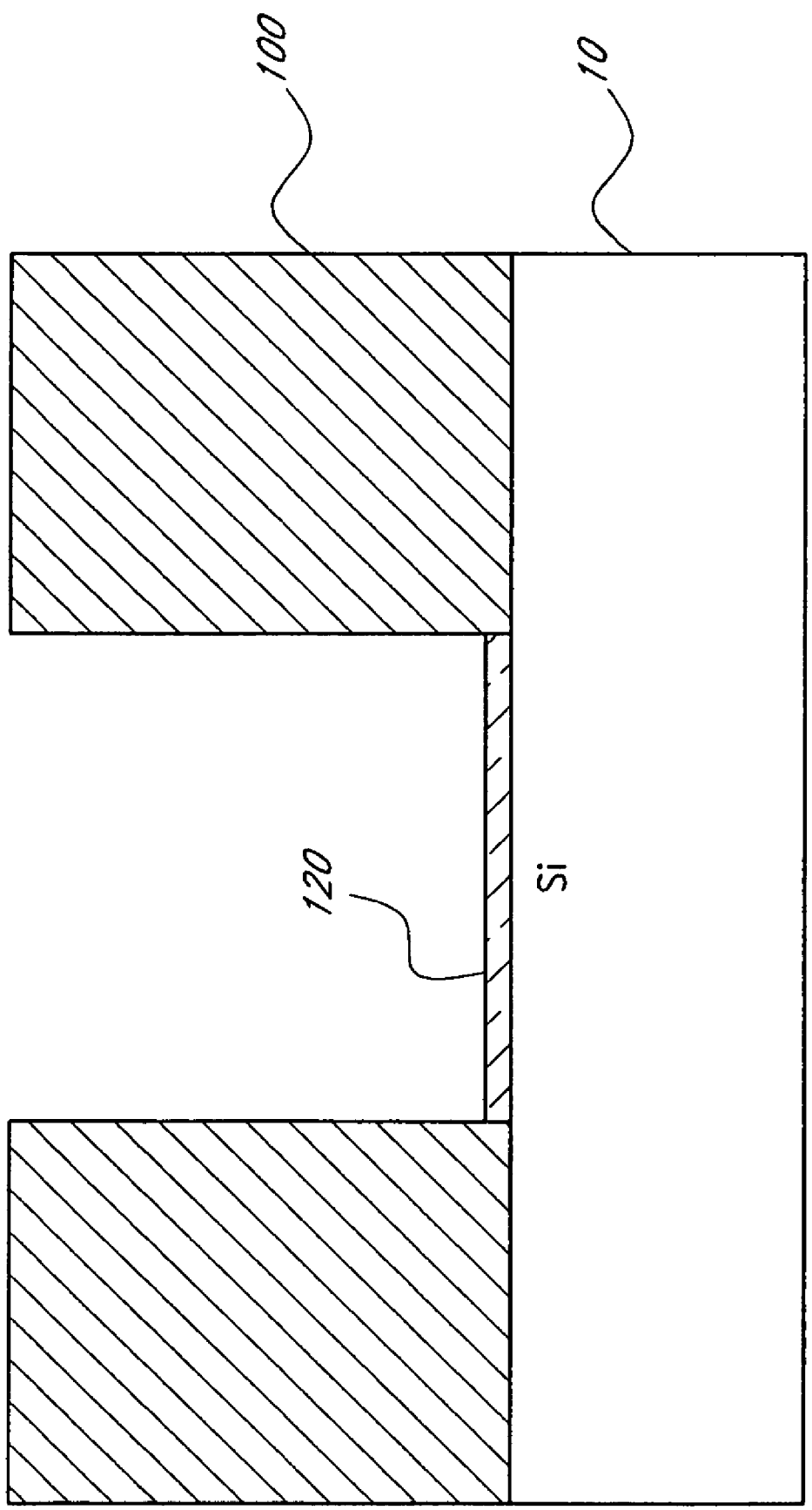
Figure 21:
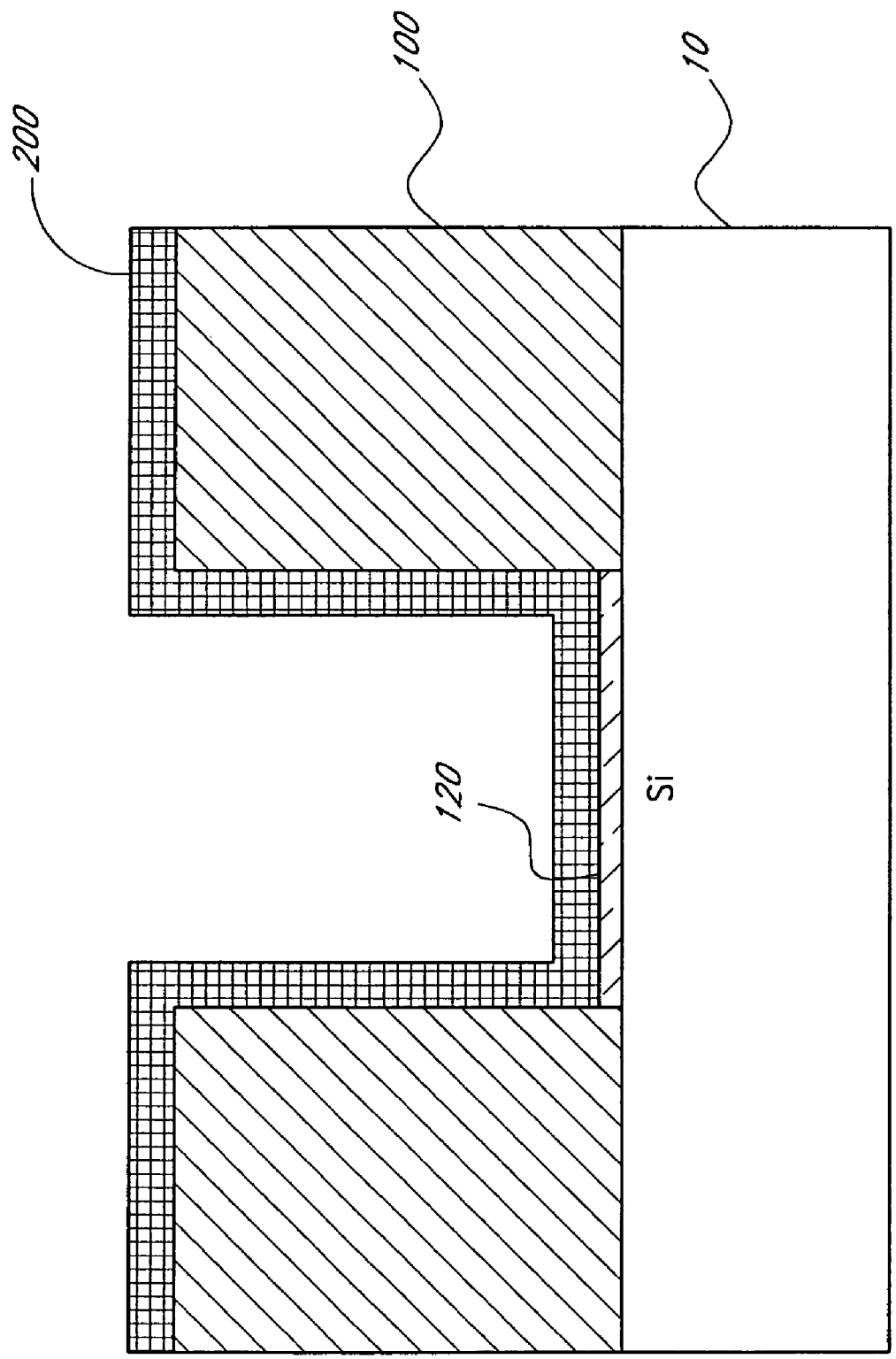
Figure 22:
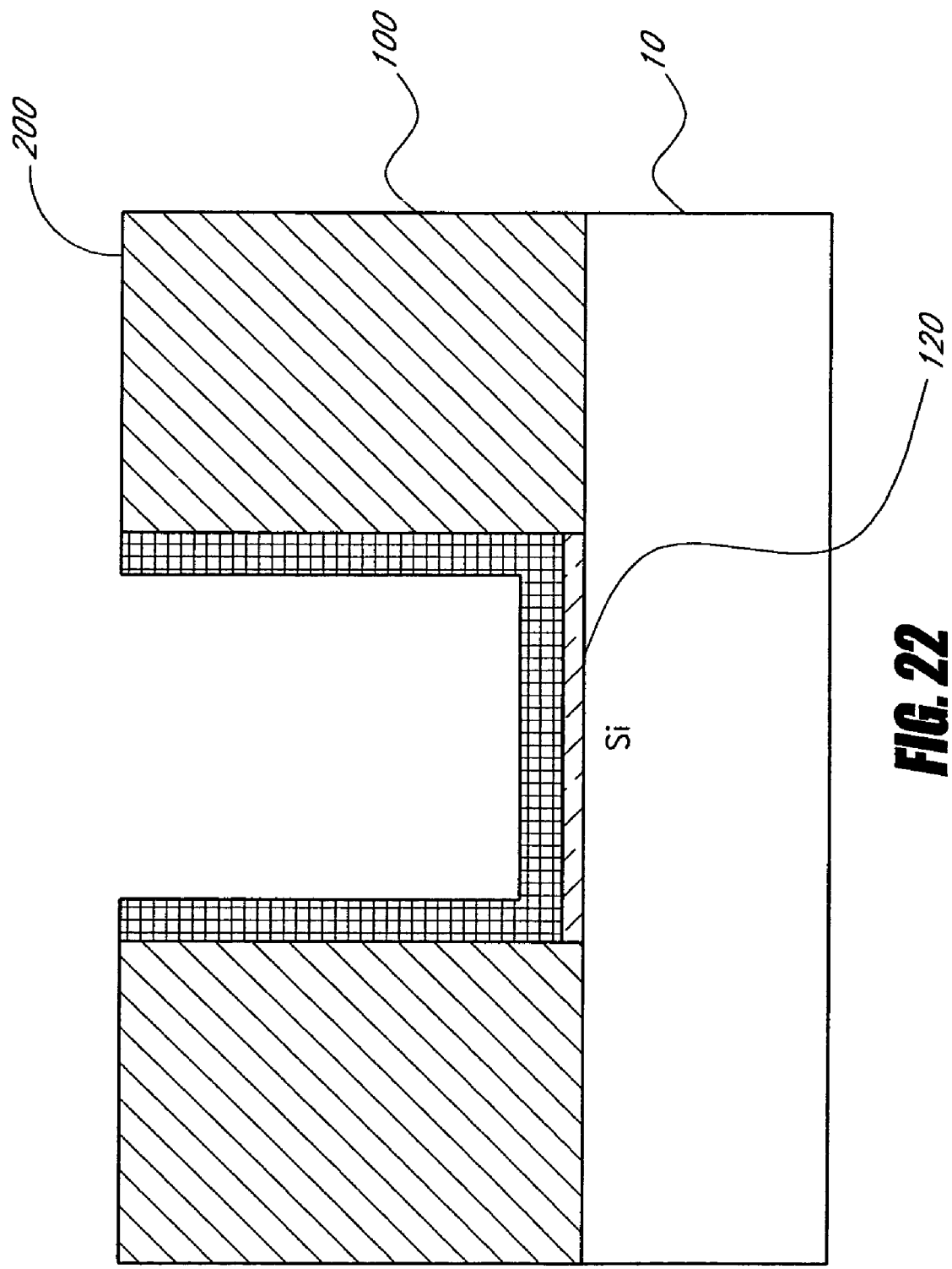
Figure 23:
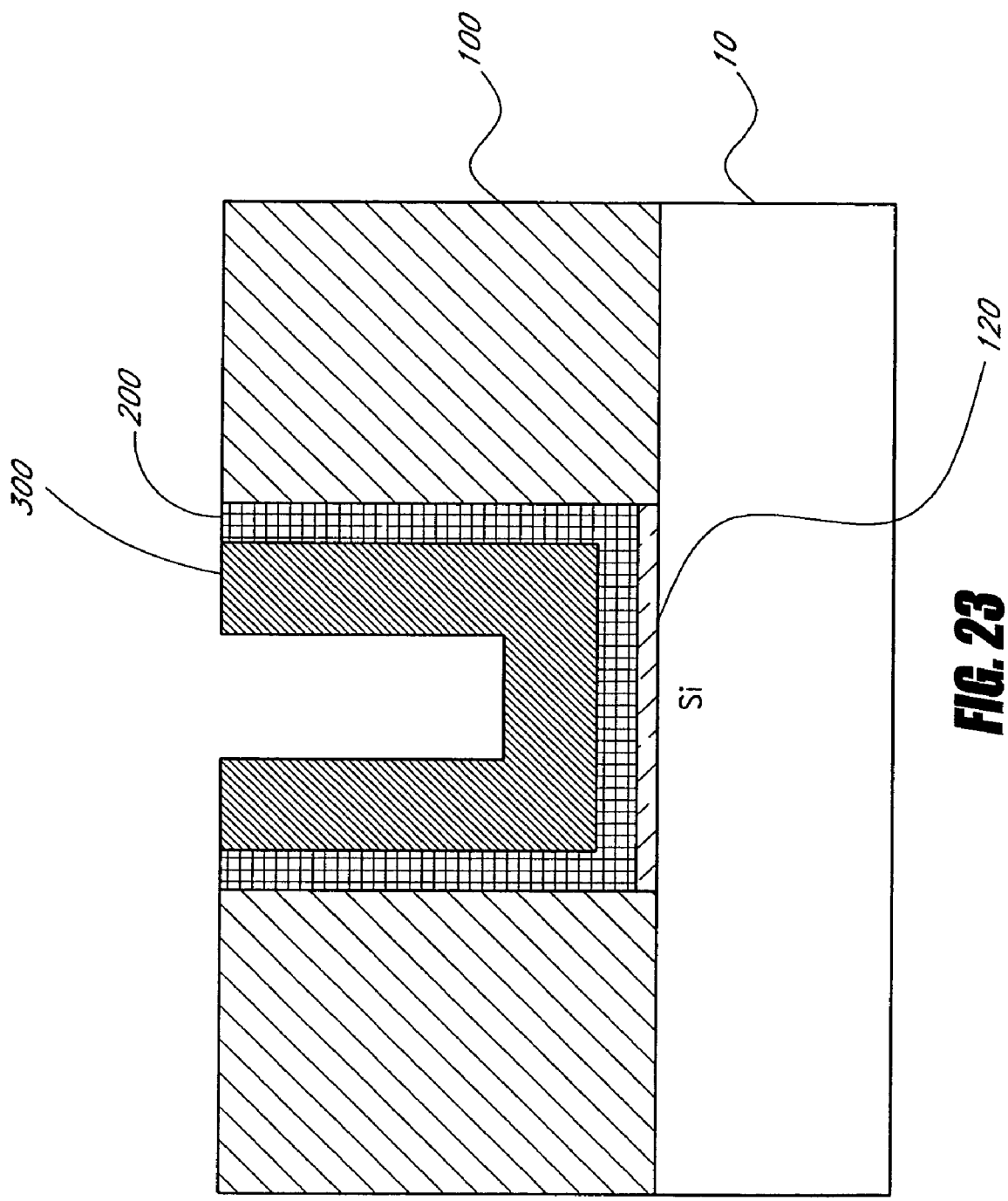

In another gate last approach a silicon substrate 10 covered with native oxide 50 is provided (FIG. 17). The native oxide 50 is optionally removed, followed by deposition of a layer of silicon oxide 100 over the substrate as shown in FIG. 18. The silicon oxide layer 100 is patterned and the exposed surface 25 (FIG. 19) is prepared for ALD of a high-k dielectric layer by pretreatment or deposition of an interfacial layer 120 as shown in FIG. 20. The interfacial layer 120 may comprise, for example, a thermally or chemically grown ultrathin silicon oxide or silicon nitride. A high-k layer 200 is then deposited by ALD over the entire structure (FIG. 21). The high-k material is removed from over the silicon oxide 100 to produce the structure illustrated in FIG. 22. This may be accomplished, for example, by filling the space over the interface layer 120 with a resist material, planarizing the resulting structure down to the top of the silicon oxide layer 100 and removing the resist material (not shown). The substrate is treated with a a halide, such as a metal halide or hydrogen halide, or metalorganic compound, such as alkyl or alkylamide compound. Finally, a ruthenium layer 300 is selectively deposited over the high-k layer 200 by atomic layer deposition (FIG. 23).

In each of the illustrated embodiments, additional processing is performed to produce the desired integrated circuit, as will be apparent to the skilled artisan.

Because ruthenium selectively deposits on the high-k material and not on the silicon oxide or oxynitride, it is not necessary to mask the oxide prior to deposition of the gate electrode material in each of these process flows.

As mentioned above, the ruthenium may form the entire gate electrode. However, in some embodiments the gate electrode comprises a further conductive material such as a metal or poly-silicon that has been deposited on the ruthenium. The additional conductive material may be deposited by ALD or by another deposition process, such as by CVD or PVD. The deposition may be selective, or may be followed by patterning steps.

Preferably, the high-k material is also deposited by an ALD process. The high-k material preferably has a k value of greater than or equal to 5, more preferably greater than or equal to 10, and even more preferably greater than or equal to 20. Exemplary high-k materials include $HfO_2$, $ZrO_2$, $Al_2O_3$, $TiO_2$, $Ta_2O_5$, $Sc_2O_3$, lanthanide oxides and mixtures thereof, silicates, materials such as yttria-stabilized zirconia (YSZ) and barium strontium titanate (BST), strontium titanate (ST), strontium bismuth tantalate (SBT) or bismuth tantalate (BT).

The following non-limiting examples are provide to illustrate the invention in more detail, but are not intended to limit the scope of the invention in any way.

EXAMPLE 1

Ruthenium thin films were deposited on 300 mm wafers from alternating pulses of bis(ethylcyclopentadienyl)ruthenium ($Ru(EtCp)_2$) and oxygen ($O_2$) at a temperature of about 370° C. No halide treatment was employed.

The pulse length of the evaporated ruthenium precursor was about 0.7 seconds and was followed by a purge with an inert gas that lasted from about 2 seconds. The pulse length of the oxygen-containing reactant was about 2 seconds and the purge thereafter was about 2 seconds.

Ruthenium was found to grow using this process on TaN, $Al_2O_3$, Ta and $HfO_2$ surfaces. The typical growth rate is about from 0.5 to 0.9 Å/cycle on these surfaces, not counting incubation time. The incubation time for Ru growth was found to be about 50-100 cycles on TaN, 50-100 cycles on $Al_2O_3$, about 50 cycles on Ta and virtually zero on $HfO_2$.

However, even 450 cycles of the same Ru process did not produce a measurable and conductive film on a thermal silicon oxide surface produced by a wet oxide process.

Where deposition was observed, the rate was independent of the $Ru(EtCp)_2$ dose, indicating that film growth proceeded in the self-limiting manner that is characteristic of ALD.

EXAMPLE 2

Ruthenium thin films were deposited from alternating pulses of bis(ethylcyclopentadienyl)ruthenium ($Ru(EtCp)_2$) and oxygen ($O_2$) on a pure $SiO_2$ surface and on a $SiO_2$ surface modified with $HfCl_4$. The reactions were carried out at 260° C. to 360° C. On the pure $SiO_2$ surface, some color began to be seen at 360° C. The low intensity of the color and the fact that the whole $SiO_2$ surface was not covered with the color indicated that only some weak reaction of the ruthenium precursor and the $SiO_2$ surface was occurring at this temperature.

At the lower temperature (260° C.) the $SiO_2$ surface remained completely white, indicating that no ruthenium growth was taking place. These results are consistent with those of Example 1 and indicate that $Ru(EtCp)_2$ is not reactive with a pure silicon surface at temperatures below about 360° C.

These results confirm that $Ru(EtCp)_2$ is highly unreactive towards a pure $SiO_2$ surface and explain the long incubation time that has been observed for the deposition of Ru metal thin films on $SiO_2$ by ALD. This is a distinct observation from the finding that surfaces comprising $SiO_2$ are not reactive with halides at temperatures less than about 300° C.

On the other hand, when the $SiO_2$ surface was treated with $HfCl_4$ prior to beginning the ALD reaction, ruthenium grew readily at both high (360° C.) and low (260° C.) ALD reaction temperatures. At 260° C. a clear reaction of $Ru(EtCp)_2$ took place and the whole $SiO_2$ surface had a distinctive and uniform brownish yellow color.

EXAMPLE 3

Bis(ethylcyclopentadienyl)ruthenium ($Ru(EtCp)_2$) was used to deposit ruthenium by ALD on pure, untreated $Al_2O_3$ and on $Al_2O_3$ that had been treated with $HfCl_4$ or $AlCl_3$.

The ALD reactions were carried out at both 260° C. and 360° C. At the higher temperature, only some non-uniform brownish color was observed on the untreated surface. At the lower temperature, the untreated $Al_2O_3$ surface remained unchanged by the deposition process.

On both the $HfCl_4$ and $AlCl_3$ treated surfaces, a uniform brown film was obtained at both temperatures. At the lower temperature the film was smoother than at the higher temperature.

Although the foregoing invention has been described in terms of certain preferred embodiments, other embodiments will be apparent to those of ordinary skill in the art. Moreover, although illustrated in connection with particular process flows and structures, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method for depositing a thin film comprising a noble metal on a substrate in a reaction chamber, the method comprising:
   forming a halide terminated surface by treating a first surface of the substrate with a gaseous halide to form the halide terminated surface on a first surface of the substrate, wherein the gaseous halide does not comprise a noble metal; and
   depositing noble metal on the treated surface from a noble metal reactant that is different from the gaseous halide and an oxygen-containing reactant using a vapor phase deposition process, wherein the halide terminated surface is not converted to a corresponding oxide prior to depositing the noble metal.

2. The method of claim 1, wherein the vapor phase deposition process is a chemical vapor deposition process.

3. The method of claim 1, wherein the vapor phase deposition process is an atomic layer deposition process.

4. The method of claim 3, wherein the atomic layer deposition process comprises alternately and sequentially contacting the substrate with a noble metal precursor and a reactant gas comprising oxygen until a thin film of a desired thickness is obtained.

5. The method of claim 3, wherein the ALD process is carried out at a temperature below about 400° C.

6. The method of claim 1 wherein the halide is selected from the group consisting of hydrogen halides and metal halides.

7. The method of claim 1, wherein the halide is selected from the group consisting of HCl, $AlCl_3$ and $HfCl_4$.

8. The method of claim 1, wherein treating is carried out at a temperature between about 100° C. and about 400° C.

9. The method of claim 1, wherein the substrate comprises $SiO_2$.

10. The method of claim 8, wherein treating is carried out at a temperature greater than about 300° C.

11. The method of claim 1, wherein the substrate comprises $HfO_2$.

12. The method of claim 1, wherein the noble metal reactant is a cyclopentadienyl or betadiketonate compound.

13. The method of claim 1, wherein the noble metal is ruthenium or iridium.

14. The method of claim 12, wherein the noble metal reactant is $Ru(EtCp)_2$.

15. The method of claim 1, additionally comprising a halide removal step between the treating and depositing steps.

16. The method of claim 15, wherein the substrate is contacted with a compound selected from the group consisting of water and ammonia.

17. The method of claim 1, wherein the halide terminated surface comprises a metal halide terminated surface.

18. An atomic layer deposition (ALD) process for depositing a thin film comprising a noble metal on a substrate in a reaction chamber, the method comprising a first and second cycle, wherein:
   the first cycle comprises alternately and sequentially contacting the substrate having a first surface termination with a vapor-phase halide and a noble metal precursor, wherein the halide terminated is not converted to oxide in the first cycle thereby forming a halide surface; and
   the second cycle comprises alternately and sequentially contacting the halide terminated surface of the substrate with the noble metal precursor and a reactant gas comprising oxygen.

19. The method of claim 18, wherein the second cycle is repeated until a thin film of the desired thickness is formed on the substrate.

20. The method of claim 18, wherein the first cycle additionally comprises a halide removal pulse.

21. The method of claim 20, wherein the halide removal pulse comprises providing water or ammonia to the reaction space.

22. The method of claim 18, wherein the noble metal precursor is a cyclopentadienyl compound.

23. The method of claim 18, wherein the first cycle and second cycle are conducted at different temperatures.

24. The method of claim 18, wherein the halide terminated surface comprises a metal halide terminated surface.

25. A method for selectively depositing a noble metal thin film on a first surface of a substrate relative to a second surface of the substrate, the method comprising:
   a) contacting the first and second surfaces with a gaseous halide at a temperature of less than about 300° C., thereby forming a halide terminated surface on the first surface or second surface;
   b) removing excess gaseous halide;
   c) contacting the first and second surfaces of the substrate that have been contacted with the gaseous halide with a gaseous noble metal precursor to form no more than about a single molecular layer on the first surface;
   d) removing excess noble metal precursor from the reaction chamber;
   e) providing a second reactant gas and any reaction by-products from the reaction chamber; and
   f) removing excess second reactant gas and any reaction by-products from the reaction chamber; and
   repeating steps c) through f) until a thin film is obtained on the first surface relative to the second surface, wherein no reactant is provided between step b) and step c),
   wherein the first surface is a high k material and the second surface comprises $SiO_2$.

26. The process of claim 25, wherein the noble metal thin film is not formed on the second surface.

27. The process of claim 25, wherein the noble metal thin film that is obtained is thicker on the first surface than on the second surface.

28. The process of claim 25, wherein the second surface is $SiO_2$.

29. The process of claim 25, wherein the noble metal is ruthenium.

30. The process of claim 25 wherein the high-k material is selected from the group consisting of $HfO_2$, $ZrO_2$, $Al_2O_3$, $TiO_2$, $Ta_2O_5$, lanthanide oxides and mixtures thereof, silicates, yttria-stabilized zirconia (YSZ), barium strontium titanate (BST), strontium titanate (ST), strontium bismuth tantalate (SBT) and bismuth tantalate (BT).

31. The method of claim 25, wherein the halide terminated surface comprises a metal halide terminated surface.

32. A method for depositing a noble metal on a substrate in a reaction chamber comprising quartz walls while avoiding deposition on the reaction chamber walls, the method comprising:
   providing a gaseous halide to the reaction chamber at a temperature of less than about 300° C. thereby forming a halide terminated surface on the surface of the substrate, wherein the gaseous halide does not comprise a noble metal;

removing excess halide; and depositing noble metal on the substrate surface having the halide terminated surface by an atomic layer deposition process (ALD) from a noble metal reactant and an oxygen reactant at a temperature less than or equal to 300° C.

33. The method of claim 27, wherein the substrate comprises one or more of $HfO_2$, $Al_2O_3$ and silicon.

34. The method of claim 27, wherein the noble metal reactant is a cyclopentadienyl reactant.

35. The method of claim 27, wherein the noble metal is ruthenium.

36. The method of claim 32, wherein the halide terminated surface comprises a metal halide terminated surface.

37. A method of forming a thin film comprising a noble metal on a substrate in a reaction chamber, the method comprising:
   a) depositing a first film having a first surface termination on the substrate by an atomic layer deposition (ALD) process comprising alternate and sequential pulses of a metal reactant and a second reactant, wherein the metal reactant is a halide and does not comprise a noble metal;
   b) treating the deposited first film with the metal reactant to form a second surface termination on a surface of the substrate that is different from the surface termination of the first film; and
   c) depositing the thin film comprising a noble metal by ALD on the surface of the substrate having the second surface termination.

38. The method of claim 37, wherein the first film is a metal oxide.

39. The method of claim 38, wherein the first film is a hafnium oxide film.

40. The method of claim 37, wherein the metal reactant is $HfCl_4$.

41. The method of claim 37, wherein the noble metal is ruthenium.

42. A method for depositing a thin film comprising a noble metal on a substrate in a reaction chamber, the method comprising:
   treating a first surface of the substrate with a gaseous halide terminated to form a halide surface on a first surface of the substrate; and
   depositing noble metal from a noble metal reactant that is different from the gaseous halide and an oxygen-containing reactant using a vapor phase deposition process, wherein the halide terminated surface is not converted to a corresponding oxide prior to depositing the noble metal.

43. The method of claim 42, wherein the halide terminated surface comprises a metal halide terminated surface.

* * * * *